US012638527B2

(12) United States Patent
Gao et al.

(10) Patent No.: US 12,638,527 B2
(45) Date of Patent: May 26, 2026

(54) MAGNETIC RESONANCE IMAGING SYSTEMS AND COMPONENTS THEREOF

(71) Applicant: SHANGHAI UNITED IMAGING HEALTHCARE CO., LTD., Shanghai (CN)

(72) Inventors: Yuan Gao, Shanghai (CN); Shuguang Liu, Shanghai (CN); Jiwen Yang, Shanghai (CN); Fei Li, Shanghai (CN); Tao Wang, Shanghai (CN); Lifeng Wang, Shanghai (CN); Man Fan, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 71 days.

(21) Appl. No.: 18/429,364

(22) Filed: Jan. 31, 2024

(65) Prior Publication Data

US 2024/0219494 A1     Jul. 4, 2024

Related U.S. Application Data

(63) Continuation of application No. PCT/CN2022/105444, filed on Jul. 13, 2022.

(30) Foreign Application Priority Data

Aug. 6, 2021   (CN) .......................... 202121829303.6
Apr. 13, 2022   (CN) .......................... 202210384598.3

(51) Int. Cl.
G01R 33/38        (2006.01)
G01R 33/3815      (2006.01)
(Continued)

(52) U.S. Cl.
CPC ..... *G01R 33/3852* (2013.01); *G01R 33/3815* (2013.01); *G01R 33/3873* (2013.01)

(58) Field of Classification Search
CPC ............ G01R 33/3852; G01R 33/3815; G01R 33/3873; G01R 33/4215; G01R 33/385; A61B 5/055
See application file for complete search history.

(56) References Cited

U.S. PATENT DOCUMENTS 4,733,189 A * 3/1988 Punchard ........... G01R 33/3875
                                                     324/318
5,012,191 A     4/1991 Siebold et al.
(Continued)

FOREIGN PATENT DOCUMENTS

CN        205787072 U      12/2016
CN        106291422 A      1/2017
(Continued)

OTHER PUBLICATIONS

International Search Report in PCT/CN2022/105444 mailed on Oct. 9, 2022, 5 pages.
(Continued)

*Primary Examiner* — G.M. A Hyder
(74) *Attorney, Agent, or Firm* — METIS IP LLC

(57)     ABSTRACT

Magnetic resonance imaging (MRI) systems and compositions thereof are provided. The MRI systems may include a main magnet configured to generate a primary magnetic field, the primary magnet forming a bore. The MRI system may include a gradient coil arranged in the bore and configured to generate a gradient magnetic field that provides a magnetic field environment with the main magnetic field. The gradient coil may include a shielding gradient coil including two or more coil units. One of the two or more coil units may be wound along a first coil path. Another one of the two or more coil units may be wound along a second coil
(Continued)

path. The MRI system may also include a shimming structure arranged between the gradient coil and the primary magnet and configured to homogenize the main magnetic field.

19 Claims, 12 Drawing Sheets

(51) Int. Cl.
  _G01R 33/385_       (2006.01)
  _G01R 33/3873_      (2006.01)

(56) References Cited

U.S. PATENT DOCUMENTS

| | | | | |
|---|---|---|---|---|
| 5,708,360 | A * | 1/1998 | Yui | G01R 33/421 |
| | | | | 324/318 |
| 6,285,188 | B1 | 9/2001 | Sakakura | |
| 6,479,997 | B1 * | 11/2002 | Westphal | G01R 33/3852 |
| | | | | 324/318 |
| 6,529,005 | B1 | 3/2003 | Kasten et al. | |
| 10,024,936 | B2 | 7/2018 | Bindseil et al. | |
| 10,520,567 | B2 | 12/2019 | Aley et al. | |
| 2003/0052680 | A1 | 3/2003 | Konijn | |
| 2008/0164876 | A1 * | 7/2008 | Sakakura | G01R 33/3873 |
| | | | | 324/318 |
| 2008/0169813 | A1 | 7/2008 | Yamashita et al. | |
| 2014/0062484 | A1 * | 3/2014 | Kwak | G01R 33/3804 |
| | | | | 324/322 |
| 2014/0176138 | A1 | 6/2014 | Imamura et al. | |
| 2017/0038444 | A1 | 2/2017 | Seeber et al. | |

FOREIGN PATENT DOCUMENTS

| | | |
|---|---|---|
| CN | 104968263 B | 11/2018 |
| CN | 215678731 U | 1/2022 |
| JP | H0549608 A | 3/1993 |
| JP | 2007175438 A | 7/2007 |
| WO | 2013122202 A1 | 8/2013 |

OTHER PUBLICATIONS

Written Opinion in PCT/CN2022/105444 mailed on Oct. 9, 2022, 6 pages.

The Extended European Search Report in European Application No. 22851842.9 mailed on Oct. 9, 2024, 10 pages.

First Office Action in Chinese Application No. 202210384598.3 mailed on Mar. 17, 2026, 16 pages.

* cited by examiner

320

300

310

310

320

400

500

600

1400

1400

1400

1400

MAGNETIC RESONANCE IMAGING SYSTEMS AND COMPONENTS THEREOF

CROSS-REFERENCE TO RELATED APPLICATION

This application is a Continuation of International Application No. PCT/CN2022/105444, filed on Jul. 13, 2022, which claims priority of Chinese Patent Application No. 202121829303.6, filed on Aug. 6, 2021, and Chinese Patent Application No. 202210384598.3, filed on Apr. 13, 2022, the contents of each of which are incorporated herein by reference.

TECHNICAL FIELD

This disclosure generally relates to magnetic resonance imaging (MRI) systems, and more particularly, to components (e.g., gradient coil assemblies and shimming structures) of the MRI system.

BACKGROUND

With the development of medical imaging technology, MRI systems play a significant role in medical diagnosis and/or research. An MRI system usually includes an imaging device that is made according to the principles of magnetic resonance, which involve using hydrogen atoms in Larmor precession in a homogenous main magnetic field (B0 field) to generate magnetic resonance phenomena under excitation of a radio frequency field and using spatial coding positioning of gradient magnetic field to achieve MRI imaging. Most of the MRI systems include core components such as primary magnets, gradient coil assemblies (e.g., including gradient coils), etc.

Generally, the gradient coils are wound by multiple conductors along a single coil path, in which the gradient coils are distributed sparsely and the current distribution of the gradient coils is concentrated, resulting in a large dissipated field formed in the periphery of the gradient coil assembly. The dissipated field can generate an eddy current in the primary magnet that affects the use of the MRI system, which in turn affects the image quality of the MRI system. The primary magnet is used to provide the main magnetic field, the homogeneity of which can directly affect the image quality of the MRI system. This is why shimming structures are needed to make the main magnetic field more homogenous. Further, it is desirable to provide effective designs of the gradient coil assembly and the shimming structure for reducing the dissipated field outside the gradient coil assembly and improving the homogeneity of the main magnetic field, thereby improving the image quality of the MRI system.

SUMMARY

In one aspect of the present disclosure, a gradient coil assembly may be provided. The gradient coil assembly may include a primary gradient coil and a shielding gradient coil. The primary gradient coil and the shielding gradient coil may be arranged co-axially around an axis. The shielding gradient coil may be peripheral to the primary gradient coil in reference to the axis. The shielding gradient coil may include two or more coil units. One of the two or more coil units may be wound along a first coil path. Another one of the two or more coil units may be wound along a second coil path. The first coil path may be different from the second coil path.

In some embodiments, the shielding gradient coil may include a first coil layer and a second coil layer. The first coil layer may be electrically connected with the second coil layer.

In some embodiments, the first coil path may include an inner coil path, and the second coil path may include an outer coil path. The first coil layer may include a first inner coil unit and a first outer coil unit. The first inner coil unit may be one of the two or more coil units wound along the first coil path and the first outer coil unit may be another of the two or more coil units wound along the second coil path. The second coil layer may include a second inner coil unit and a second out coil unit. The second inner coil unit may be one of the two or more coil units wound along the first coil path and the second outer coil unit may be another one of the two or more coil units wound along the second coil path.

In some embodiments, the first inner coil unit may be electrically connected with the second outer coil unit, and the first outer coil unit may be electrically connected with the second inner coil unit.

In some embodiments, the first inner coil unit may include a first end extending to a center of the first coil layer. The first outer coil unit may include a second end extending to the center of the first coil layer. The second inner coil unit may include a third end extending to a center of the second coil layer. The second outer coil unit may include a fourth end extending to the center of the second coil layer. The first inner coil unit may be electrically connected with the second outer coil unit by electrically connecting the first end and the fourth end. The first outer coil unit may be electrically connected with the second inner coil unit by electrically connecting the second end and the third end.

In some embodiments, the first inner coil unit may include a first inner conductor and a first outer conductor that are co-wound along the first coil path to form the first inner coil. The first outer coil unit may include a second inner conductor and a second outer conductor that are co-wound along the second coil path to form the first outer coil. An end of the first inner conductor at an edge of the first coil layer may be electrically connected with an end of the first outer conductor at the edge of the first coil layer. An end of the second outer conductor at the edge of the first coil layer may be connected with an end of the second inner conductor at the edge of the first coil layer.

In some embodiments, the first inner coil unit may include a fifth end at an edge of the first coil layer. The first outer coil unit may include a sixth end at the edge of the first coil layer. The second inner coil unit may include a seventh end at an edge of the second coil layer. The second outer coil unit may include an eighth end at the edge of the second coil layer. The fifth end and the sixth end may be packaged as a first interface. The seventh end and the eighth end may be packaged as a second interface.

In some embodiments, the first coil layer and the second coil layer may be arranged to form a single plane, or the first coil layer and the second coil layer may be arranged to form two parallel planes.

In some embodiments, the primary gradient coil or the shielding gradient coil may include a saddle coil or a Maxwell coil.

In some embodiments, the primary gradient coil or the shielding gradient coil may include at least one of an X-axis coil, a Y-axis coil, or a Z-axis coil.

In another aspect of the present disclosure, a superconducting magnet device is provided. The superconducting magnet device may include a superconducting magnet, a gradient coil, and a shimming structure. The shimming structure may include a support unit arranged between the gradient coil and the superconducting magnet. At least one accommodating cavity may be formed between the support unit and the superconducting magnet. The shimming structure may also include a shimming unit arranged within the at least one accommodating cavity.

In some embodiments, the support unit may be further configured to support the gradient coil.

In some embodiments, the superconducting magnet may form a bore that has an axis, and the shimming structure may be arranged in the bore.

In some embodiments, the support unit may include a support drum arranged co-axially with the bore around the axis and configured to support the gradient coil. The support unit may also include a plurality of support bars arranged around the axis and parallel to the axis. The plurality of support bars may be placed between and connected to an outer surface of the support drum and an inner surface of the superconducting magnet, such that the at least one accommodating cavity may be formed between the support drum and the superconducting magnet.

In some embodiments, the plurality of support bars may be spaced apart along a circumferential direction of the superconducting magnet.

In some embodiments, the support unit may further include a damping layer connected to an inner surface of the support drum.

In some embodiments, the shimming structure may further include a first end-ring connected to a first end of the support unit and a first end of the shimming unit.

In some embodiments, the shimming structure may further include a second end-ring connected to a second end of the support unit and a second end of the shimming unit.

In some embodiments, the shimming unit may include a main shimming bar and at least two auxiliary shimming bars that are arranged along a circumferential direction of the superconducting magnet. The main shimming bar may be arranged between the at least two auxiliary shimming bars.

In some embodiments, a width of the main shimming bar along the circumferential direction of the superconducting magnet may be greater than a width of each of the at least two auxiliary shimming bars along the circumferential direction of the superconducting magnet.

In some embodiments the gradient coil may include a primary gradient coil and a shielding gradient coil. The primary gradient coil and the shielding gradient coil may be arranged co-axially around the axis of the bore. The shielding gradient coil may be peripheral to the primary gradient coil in reference to the axis of the bore. The shielding gradient coil may include at least two coil units. One of the at least two coil units may be wound along a first coil path. Another one of the at least two coil units may be wound along a second coil path. The first coil path may be different from the second coil path.

In another aspect of the present disclosure, a magnetic resonance imaging (MRI) system is provided. The MRI system may include a main magnet configured to generate a primary magnetic field. The primary magnet forming a bore. The MRI system may also include a gradient coil arranged in the bore and configured to generate a gradient magnetic field that provides a magnetic field environment with the primary magnetic field. The gradient coil may include a shielding gradient coil including two or more coil units. One of the two or more coil units may be wound along a first coil path. Another one of the two or more coil units may be wound along a second coil path. The first coil path may be different from the second coil path. The MRI system may also include a shimming structure arranged between the gradient coil and the primary magnet and configured to homogenize the primary magnetic field. The shimming structure may include a support unit arranged between the gradient coil and the primary magnet. At least one accommodating cavity may be formed between the support unit and the primary magnet. The shimming structure may also include a shimming unit arranged within the at least one accommodating cavity.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

Figure 1:
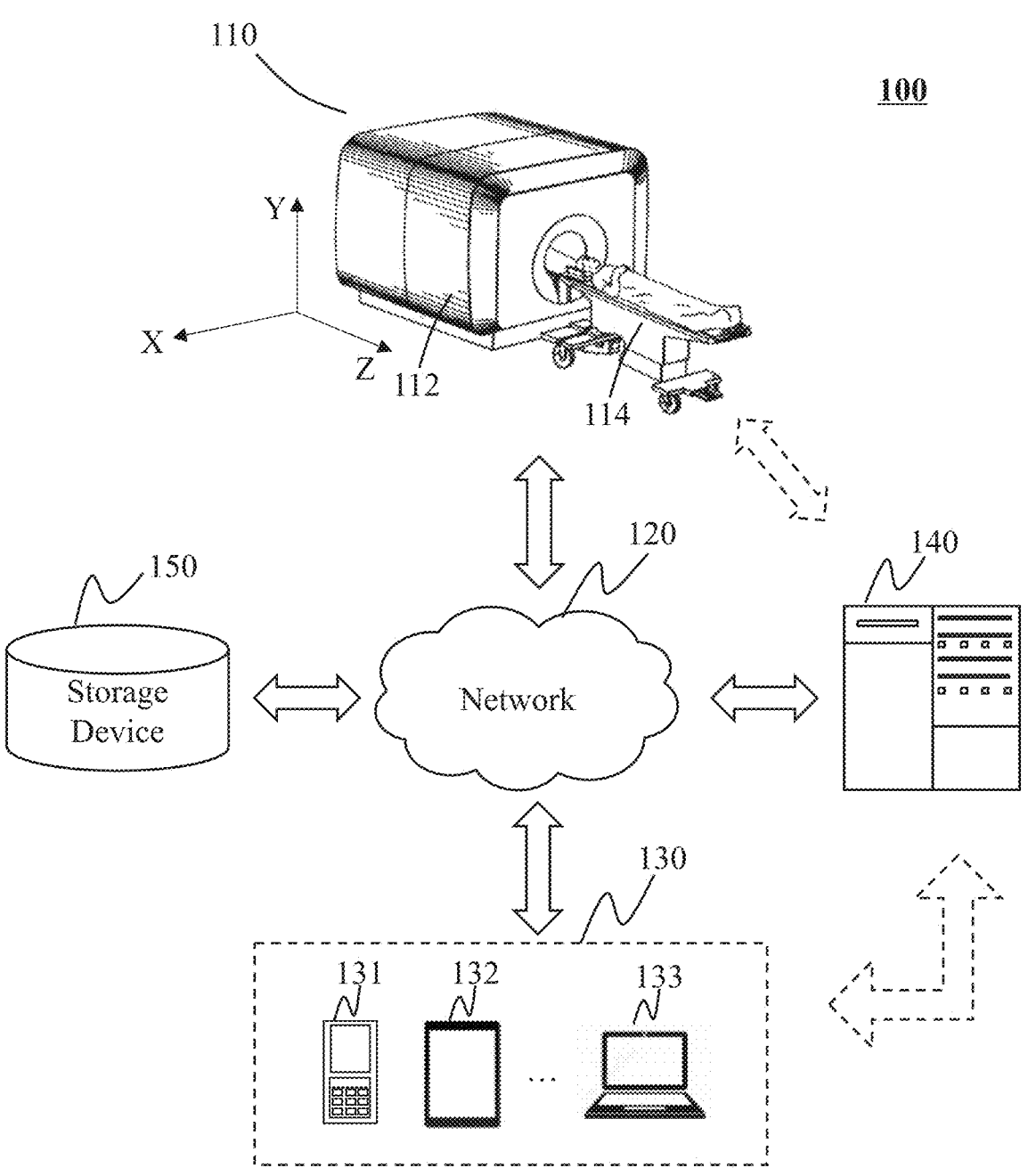
FIG. 1 is a schematic diagram illustrating an exemplary MRI system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

Provided herein are systems and components for medical imaging and/or medical treatment. In some embodiments, the medical system may include an imaging system. The imaging system may include a single modality imaging system and/or a multi-modality imaging system. The single modality imaging system may include, for example, a magnetic resonance imaging (MRI) system. Exemplary MRI systems may include a superconducting magnetic resonance imaging system, a non-superconducting magnetic resonance imaging system, etc.

In an MRI imaging system, a gradient coil assembly may be arranged within a bore formed by a main magnet (e.g., a superconducting magnet). In the present disclosure, the term "arrange" refers to "position (verb)", "dispose", "install", "bent to (a shape)", or a combination thereof. When the MRI imaging system performs a scan, a dissipated field is generated in the periphery of the gradient coil assembly. The dissipated field outside the gradient coil assembly may generate an eddy current in the primary magnet. When the dissipated field is strong enough (e.g., stronger than a preset dissipated field), the dissipated field may affect on the primary magnet and heat the primary magnet, resulting in an increase of primary magnet pressure and a reduction of work duration of the MRI system, thereby impairing the overall performance of the MRI system. In some serious cases, the primary magnet may even lose its superconductivity. Therefore, it is desirable to provide an improved design for the gradient coil assembly, thereby reducing the dissipated field outside the gradient coil assembly.

According to an aspect of the present disclosure, a gradient coil assembly of an MRI system/device is provided. The gradient coil assembly may include a primary gradient coil and a shielding gradient coil. The primary gradient coil and the shielding gradient coil may be arranged co-axially around an axis. The shielding gradient coil may be peripheral to the primary gradient coil in reference to the axis. The shielding gradient coil may include two or more coil units. One of the two or more coil units may be wound along a first coil path. Another one of the two or more coil units may be wound along a second coil path. The first coil path may be different from the second coil path. According to the design of the gradient coil assembly, an intensity of a gradient magnetic field generated by the gradient coil assembly may be kept unchanged in a field of view (FOV) of the MRI system, and the current in the gradient coil assembly may be divided into multiple paths (e.g., two paths) for transmission, which enlarges a distribution of the current in the gradient coil assembly and reduces the intensity of the dissipated field outside the gradient coil assembly, thereby ensuring the stability and the working hours of the MRI system/device.

In some embodiments, since the fabrication, installation, and/or low-temperature shrinkage of the MRI system may cause an error or deviation, it may be difficult to achieve a desired homogeneity according to a theoretical design for the main magnetic field generated by the primary magnet of the MRI system. Accordingly, an additional shimming operation may be needed to make the main magnetic field more homogenous. Generally, to improve the homogeneity of the magnet field, one or more shimming bars that are made of soft magnetic materials (e.g., silicon steel) may be fixed in the gradient coil assembly. The homogeneity of the main magnetic field may be adjusted by changing a count (or the number) and/or distribution of the shimming bars. However, in real-world practice, after the gradient magnetic field is generated, certain factors would make homogenization difficult. For example, the main magnetic field would generate a magnetic force on the gradient coil assembly, especially in an ultra-high field system (e.g., a superconducting magnet system), causing the shimming bars to vibrate and resulting in a poor shimming effect. In addition, the gradient magnetic field would generate heat under working conditions, and the magnetic permeability would likely be changed after the shimming bars absorb the heat, which may also undermine the shimming effects. Therefore, it is also desirable to provide an improved design for a shimming structure, thereby improving the homogeneity of the main magnetic field.

In another aspect of the present disclosure, a magnet assembly (e.g., a superconducting magnet device) including a superconducting magnet, a gradient coil, and a shimming structure is provided. The shimming structure may include a support unit arranged between the gradient coil and the superconducting magnet. At least one accommodating cavity may be formed between the support unit and the superconducting magnet. The shimming structure may also include a shimming unit arranged within the at least one accommodating cavity. According to the design of the superconducting magnet device, the support unit may be arranged between the superconducting magnet and the gradient coil. In such cases, during the superconducting magnet is working, the vibration generated by the gradient coil assembly may not be transmitted to the shimming unit, such that the shimming unit has well position stability, thereby improving the homogeneity and stability of the main magnetic field generated by the superconducting magnet. In addition, the heat generated by the gradient coil assembly may not be directly transmitted to the shimming unit, such that the magnetic permeability of the shimming unit may remain stable, which further ensures the shimming stability. Thus, the superconducting magnet device may generate a magnetic field with well homogeneity and stability.

FIG. 1 is a schematic diagram illustrating an exemplary MRI system according to some embodiments of the present disclosure. As illustrated, the MRI system 100 may include an MRI scanner (also referred to as an MRI device) 110, a network 120, a terminal 130, a processing device 140, and a storage device 150. The components of the MRI system 100 may be connected in one or more of various ways. Merely by way of example, as illustrated in FIG. 1, the MRI scanner 110 may be connected to the processing device 140 through the network 120. As another example, the MRI scanner 110 may be connected to the processing device 140 directly (as indicated by the bi-directional arrow in dotted lines linking the MRI scanner 110 and the processing device 140). As a further example, the storage device 150 may be connected to the processing device 140 directly or through the network 120. As still a further example, a terminal device (e.g., 131, 132, 133, etc.) may be connected to the processing device 140 directly (as indicated by the bi-directional arrow in dotted lines linking the terminal 130 and the processing device 140) or through the network 120.

The MRI scanner 110 may scan an object located within its detection region and generate a plurality of data relating to the object. In the present disclosure, "subject" and "object" are used interchangeably. Merely by way of example, the object may include a patient, a man-made object, etc. As another example, the object may include a specific portion, organ, and/or tissue of a patient. For example, the object may include head, brain, neck, body, shoulder, arm, thorax, cardiac, stomach, blood vessel, soft tissue, knee, feet, or the like, or any combination thereof. In some embodiments, the MRI scanner 110 may be a close-bore scanner or an open-bore scanner.

In the present disclosure, the X axis, the Y axis, and the Z axis shown in FIG. 1 may form an orthogonal coordinate system. The X axis and the Z axis shown in FIG. 1 may be horizontal, and the Y axis may be vertical. As illustrated, the positive x-direction along the X axis may be from the right side to the left side of the MRI scanner 110 seen from the direction facing the front of the MRI scanner 110; the positive y-direction along the Y axis shown in FIG. 1 may be from the lower part to the upper part of the MRI scanner 110; the positive z-direction along the Z axis shown in FIG. 1 may refer to a direction in which the object is moved out of the detection region (or referred to as the bore) of the MRI scanner 110. More descriptions of the MRI scanner 110 may be found elsewhere in the present disclosure. See, e.g., FIG. 2 and the description thereof.

In some embodiments, the MRI scanner 110 may include a gantry 112 and a patient support 114 (e.g., along the z-direction). In some embodiments, the gantry 112 may be configured to support magnets (e.g., a main magnet 201 in FIG. 2), coils (e.g., a gradient coil assembly 202 and/or a radio frequency (RF) coil assembly 203 in FIG. 2), etc. The gantry 112 may surround, along the z-direction, the object that is moved into or located within the detection region. In some embodiments, the patient support 114 may be configured to support the object. In some embodiments, the patient support 114 may have 6 degrees of freedom, for example, three translational degrees of freedom along three coordinate directions (i.e., x-direction, y-direction, and z-direction) and three rotational degrees of freedom around the three coordinate directions. Accordingly, the object may be positioned by the patient support 114 within the detection region.

Merely by way of example, the patient support 114 may move the object into the detection region along the z-direction in FIG. 1.

The network 120 may include any suitable network that can facilitate the exchange of information and/or data for the MRI system 100. In some embodiments, one or more components of the MRI system 100 (e.g., the MRI scanner 110, the terminal 130, the processing device 140, or the storage device 150) may communicate information and/or data with one or more other components of the MRI system 100 via the network 120. In some embodiments, the network 120 may be any type of wired or wireless network, or a combination thereof.

The terminal 130 may include a mobile device 131, a tablet computer 132, a laptop computer 133, or the like, or any combination thereof. In some embodiments, the mobile device 131 may include a smart home device, a wearable device, a smart mobile device, a virtual reality device, an augmented reality device, or the like, or any combination thereof. In some embodiments, the terminal 130 may remotely operate the MRI scanner 110 and/or the processing device 140. In some embodiments, the terminal 130 may operate the MRI scanner 110 and/or the processing device 140 via a wireless connection. In some embodiments, the terminal 130 may receive information and/or instructions inputted by a user, and send the received information and/or instructions to the MRI scanner 110 or to the processing device 140 via the network 120. In some embodiments, the terminal 130 may receive data and/or information from the processing device 140. In some embodiments, the terminal 130 may be part of the processing device 140. In some embodiments, the terminal 130 may be omitted.

Figure 13:
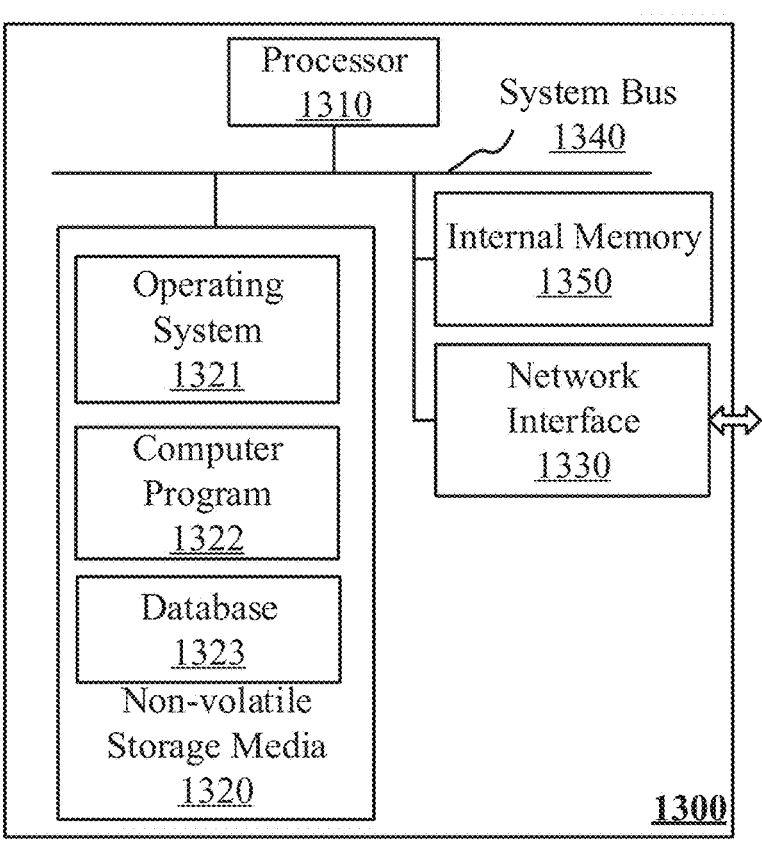
FIG. 13 is a block diagram illustrating an exemplary computer device according to some embodiments of the present disclosure.

The processing device 140 may process data and/or information obtained from the MRI scanner 110, the terminal 130, and/or the storage device 150. For example, the processing device 140 may process MR signals for generating MR images. As another example, the processing device 140 may perform one or more operations (such as pre-processing, comparing processing, transforming processing, analysis processing, or calculating processing) on MR signals received by RF coil assembly of the MRI scanner 110 to generate an MR image (e.g., a 2D image, a 3D image, etc.). In some embodiments, the processing device 140 may be a single server, or a server group. The server group may be centralized or distributed. In some embodiments, the processing device 140 may be local or remote. In some embodiments, the processing device 140 may be implemented on a cloud platform. In some embodiments, the processing device 140 may be implemented in a computer imaging system. For example, the computer imaging system may include a computer device 1300 (e.g., a server) as shown in FIG. 13. The computer device 1300 may include a processor 1310, a storage device, and a network interface 1330 that are connected via a system bus 1340. The processor 1310 may be configured to provide computing and/or control capacity. The storage device 1320 may include a non-volatile storage media 1320, an internal memory 1350, etc. The non-volatile storage media 1320 may be used to store an operating system 1321, a computer program 1322, and a database 1323. The internal memory 1350 may provide an environment for the operation of the operating system 1321 and the computer program 1322 in the non-volatile storage medium 1320. The database 1323 may be used to store magnetic resonance signals. The network interface 1330 may be used to communicate with an external endpoint via a network connection. The computer program 1322 may be executed by the processor 1310 to process magnetic resonance signals and generate magnetic resonance images.

The storage device 150 may store data and/or instructions. In some embodiments, the storage device 150 may store data obtained from the MRI scanner 110, the terminal 130, and/or the processing device 140. In some embodiments, the storage device 150 may store data and/or instructions that the processing device 140 may execute or use to perform exemplary methods described in the present disclosure. In some embodiments, the storage device 150 may include a mass storage device, a removable storage device, a volatile read-and-write memory, a read-only memory (ROM), or the like, or any combination thereof. In some embodiments, the storage device 150 may be implemented on a cloud platform.

In some embodiments, the storage device 150 may be connected to the network 120 to communicate with one or more components of the MRI system 100 (e.g., the MRI scanner 110, the processing device 140, the terminal 130, etc.). One or more components of the MRI system 100 may access the data or instructions stored in the storage device 150 via the network 120. In some embodiments, the storage device 150 may be part of the processing device 140.

Figure 2:
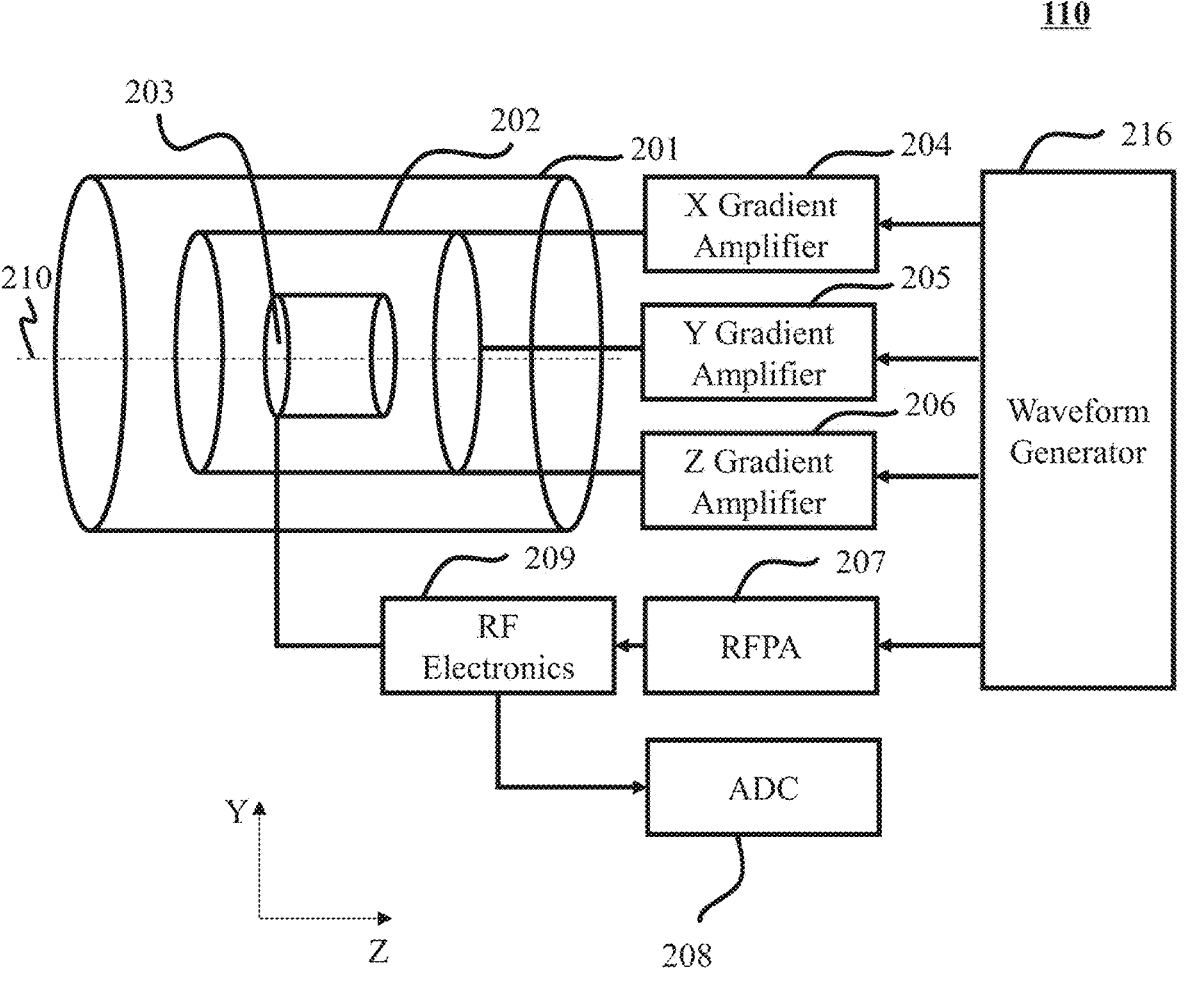
FIG. 2 is a schematic diagram illustrating an exemplary MRI scanner according to some embodiments of the present disclosure.

FIG. 2 is a schematic diagram illustrating an exemplary MRI scanner according to some embodiments of the present disclosure. As illustrated, the MRI scanner 110 may include the main magnet 201 configured to generate a first magnetic field (or referred to as a main magnetic field) that may be applied to an object (also referred to as a subject) positioned inside the first magnetic field. The main magnet 201 may include a resistive magnet or a superconductive magnet, both of which need a power supply (not shown in FIG. 2) for operation. Alternatively, the main magnet 201 may include a permanent magnet. The main magnet 201 may form a bore (e.g., including the detection region) with an axis 210 parallel to the z-direction and surround, around the z-direction, the object that is moved into or positioned within the detection region. The main magnet 201 may also control the homogeneity of the generated main magnetic field.

The MRI scan 110 may include the gradient coil assembly 202 located inside the main magnet 201. For example, the gradient coil assembly 202 may be located in a bore formed by the main magnet 201. The gradient coil assembly 202 may surround, around the z-direction, the object that is moved into or positioned within the detection region. The gradient coil assembly 202 may be surrounded by the main magnet 201 around the z-direction, and be closer to the object than the main magnet 201. That is, the main magnet 201 may be peripheral to the gradient coil assembly 202 in reference to (e.g., with respect to) the axis 210. The gradient coil assembly 202 may be configured to generate a second magnetic field (or referred to as a gradient magnetic field, including gradient magnetic fields Gx, Gy, and Gz). The second magnetic field may be superimposed on the main magnetic field generated by the main magnet 201 and distort the main magnetic field so that the magnetic orientations of the protons of an object may vary as a function of their positions inside the gradient magnetic field, thereby encoding spatial information into MR signals generated by the region of the object being imaged. The gradient coil assembly 202 may include X coils (also referred to as X-axis coils configured to generate the gradient magnetic field Gx corresponding to the x-direction), Y coils (also referred to as Y-axis coils configured to generate the gradient magnetic field Gy corresponding to the y-direction), and/or Z coils (also referred to Z-axis coils configured to generate the gradient magnetic field Gz corresponding to the z-direction) (not shown in FIG. 2). In some embodiments, the Z coils may be designed based on a circular (Maxwell) coil configuration, while the X coils and the Y coils may be designed based on a saddle (Golay) coil configuration. Alternatively, any of the X coils, Y coils, and Z coils may be designed based on the saddle coil or the Maxwell coil. The three sets of coils may generate three different gradient magnetic fields that are used for position encoding. The gradient coil assembly 202 may allow spatial encoding of MR signals for image reconstruction.

The gradient coil assembly 202 may be connected with one or more of an X gradient amplifier 204, a Y gradient amplifier 205, or a Z gradient amplifier 206. One or more of the three amplifiers may be connected to a waveform generator 216. The waveform generator 216 may generate gradient waveforms that are applied to the X gradient amplifier 204, the Y gradient amplifier 205, and/or the Z gradient amplifier 206. An amplifier may amplify a waveform. An amplified waveform may be applied to one of the coils in the gradient coil assembly 202 to generate a magnetic field in the X-axis, the Y-axis, or the Z-axis, respectively. The gradient coil assembly 202 may be designed for either a close-bore MRI scanner or an open-bore MRI scanner. In some instances, all three sets of coils of the gradient coil assembly 202 may be energized and three gradient magnetic fields may be generated thereby. In some embodiments of the present disclosure, the X coils and Y coils may be energized to generate the gradient magnetic fields in the x-direction and the y-direction. As used herein, the X-axis, the Y-axis, the Z-axis, the x-direction, the y-direction, and the z-direction in the description of FIG. 2 are the same as or similar to those described in FIG. 1.

Figure 3:
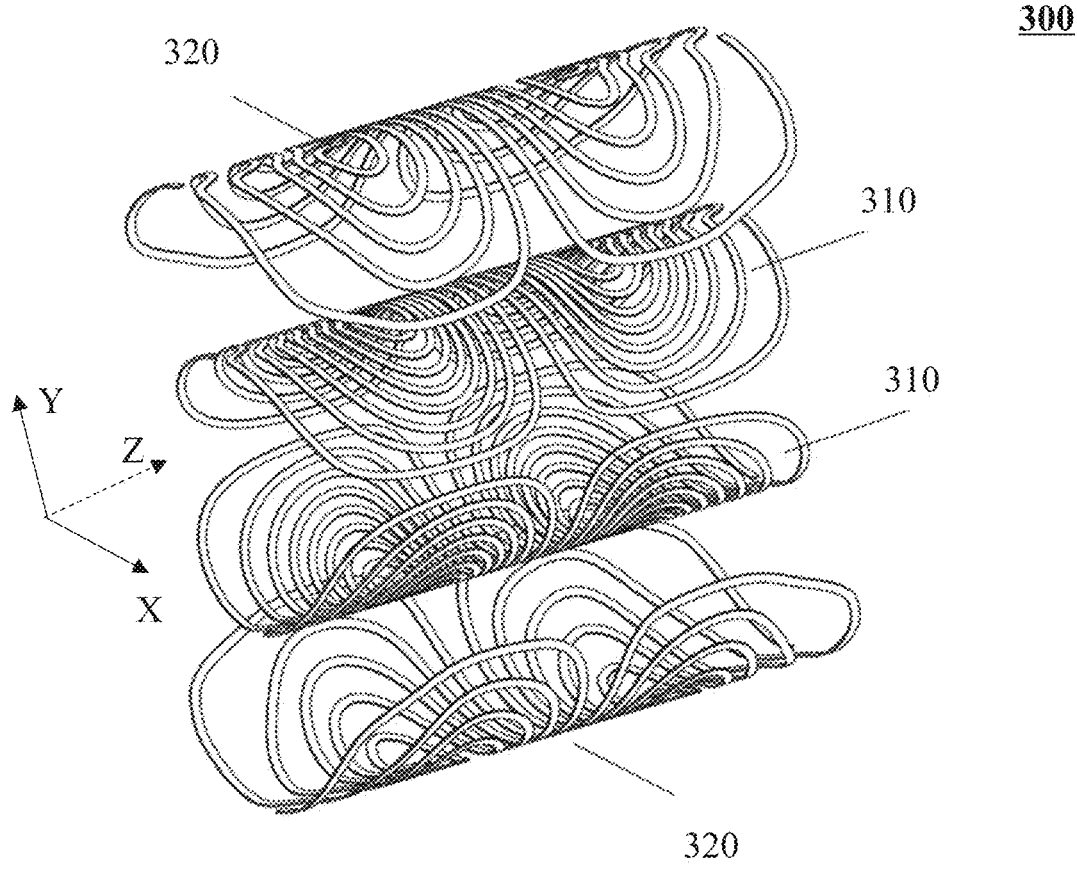
FIG. 3 is a schematic diagram illustrating an exemplary gradient coil assembly according to some embodiments of the present disclosure.
Figure 4:
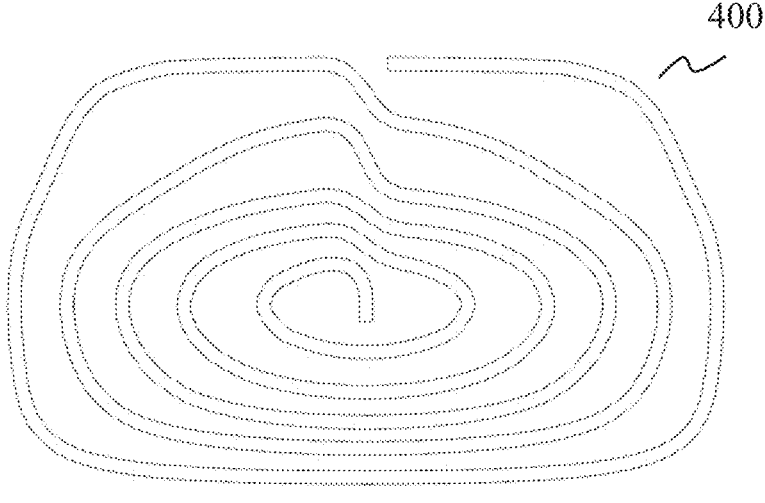
FIG. 4 is a schematic diagram illustrating an exemplary coil path according to some embodiments of the present disclosure.

In some embodiments, the gradient coil assembly 202 may include one or more primary gradient coils and one or more shielding gradient coils (not shown in FIG. 2). The primary gradient coil and the shielding gradient coil may be arranged co-axially around the axis 210. The shielding gradient coil may be peripheral to the primary gradient coil in reference to (with respect to) the axis 210. In some embodiments, the primary gradient coil or the shielding gradient coil includes at least one of an X-axis coil, a Y-axis coil, or a Z-axis coil. The primary gradient coil or the shielding gradient coil may include a saddle coil or a Maxwell coil. For example, when the primary gradient coil or the shielding gradient coil is an X-axis coil or a Y-axis coil, the primary gradient coil or the shielding gradient coil may include a saddle coil. As another example, when the primary gradient coil or the shielding gradient coil is a Z-axis coil, the primary gradient coil or the shielding gradient coil may include a Maxwell coil. As shown in FIG. 3, a gradient coil assembly 300 may include two primary gradient coils 310 and two shielding gradient coils 320. The two primary gradient coils 310 and the two shielding gradient coils 320 may be arranged co-axially around an axis (not shown). The two shielding gradient coils 320 may be peripheral to the two primary gradient coils 310 in reference to the axis. The two primary gradient coils 310 and the two shielding gradient coils 320 may be saddle coils (e.g., Y coils). In some embodiments, the shielding gradient coil may include two or more coil units. As used herein, a coil unit refers to a single coil wounded by one or more conductors (e.g., conducting wires) along a same coil path (e.g., a spiral-shaped coil path). In some embodiments, a "coil path" refers to not only a final pattern (e.g., a 2-D pattern) that a coil unit can be wound into, but also the relative positioning relationship between the coil unit and structures close to the coil unit (e.g., another coil unit in a same or neighboring coil). The conductors may be made of metal materials (e.g., silver, copper, aluminum, iron, alloy, etc.) and/or superconducting materials. FIG. 4 shows an exemplary coil path according to some embodiments of the present disclosure. One or more conductors may be wound along the coil path 400 to form a coil unit. For example, the one or more conductors may be wound along the coil path 400 in parallel. As another example, the one or more conductors may be entangled and wound along the coil path 400. In some embodiments, one of the two or more coil units may be wound along a first coil path. Another one of the two or more coil units may be wound along a second coil path. In some embodiments, the first coil path may be different from the second coil path. In some embodiments, a primary gradient coil 310 or a shielding gradient coil 320 may correspond to more than two coil paths. For example, the primary gradient coil 310 or the shielding gradient coil 320 may include a coil unit wound along the first coil path, a coil unit wound along the second coil path, and a coil unit wound along a third coil path. More descriptions regarding the gradient coil assembly may be found elsewhere in the present disclosure (e.g., FIGS. 3-13 and relevant descriptions thereof).

The MRI scanner 110 may include a shimming structure (not shown) configured to compensate for the inhomogeneity of the main magnetic field of the main magnet 201. That is, the shimming structure may be configured to make (or improve the homogeneity of) the main magnetic field generated by the main magnet 201 more homogeneous. The shimming structure may be arranged between the main magnet 201 and the gradient coil assembly 202. In some embodiments, the shimming structure may include a support unit, a shimming unit, or the like, or any combination thereof. The support unit may be arranged between the gradient coil assembly 202 and the main magnet 201 (e.g., the superconducting magnet). At least one accommodating cavity may be formed between the support unit and the superconducting magnet. The shimming unit may be arranged within the at least one accommodating cavity. More descriptions of the shimming structure may be found elsewhere in the present disclosure (e.g., FIGS. 14-20).

The MRI scanner 110 may include a radio frequency (RF) coil assembly 203 that is located inside the main magnet 201 and serve as transmitters, receivers, or both. For example, the RF coil assembly 203 may be located in the bore formed by the main magnet 201. The RF coil assembly 203 may surround, around the z-direction, the object that is moved into or positioned within the detection region. The RF coil assembly 203 may be surrounded by the main magnet 201 and/or the gradient coil assembly 202 around the z-direction, and be closer to the object than the gradient coil assembly 202. The RF coil assembly 203 may be in connection with RF electronics 209 that may be configured or used as one or more integrated circuits (ICs) functioning as a waveform transmitter and/or a waveform receiver. The RF electronics 209 may be connected to a radiofrequency power amplifier (RFPA) 207 and an analog-to-digital converter (ADC) 208. When used as transmitters, the RF coil assembly 203 may generate RF signals that provide a third magnetic field that is utilized to generate MR signals related to the region of the object being imaged. The third magnetic field may be perpendicular to the main magnetic field. When used as receivers, the RF coils may be responsible for detecting MR signals (e.g., echoes).

In some embodiments, the main magnet 201, the gradient coil assembly 202, and the RF coil assembly 203 may be arranged co-axially around the axis 210 and circumferentially positioned with respect to the object around the z-direction. It is understood by those skilled in the art that the main magnet 201, the gradient coil assembly 202, and the RF coil assembly 203 may be situated in a variety of configurations around the object.

Figures 5, 6:
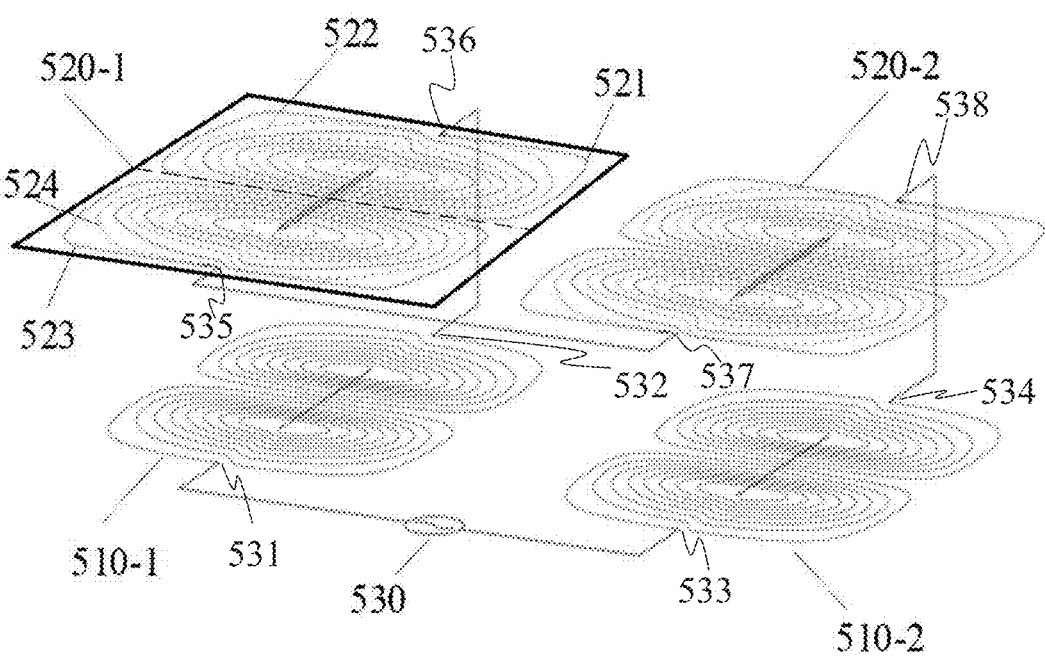
FIG. 5 is a schematic diagram illustrating an exemplary gradient coil assembly according to some embodiments of the present disclosure.
FIGS. 6-9 are schematic diagrams illustrating exemplary coil layers according to some embodiments of the present disclosure.

FIG. 5 is a schematic diagram illustrating an exemplary gradient coil assembly according to some embodiments of the present disclosure. FIG. 5 is in a plane expansion view of the gradient coil assembly 500. The gradient coil assembly 500 may include one or more primary gradient coils and one or more shielding gradient coils for generating a gradient magnetic field. As described in connection with FIG. 2, the gradient coil assembly 500 may be arranged in a bore formed by a main magnet of an MRI device (e.g., the MRI scanner 110).

As shown in FIG. 5, the gradient coil assembly 500 may include primary gradient coils 510-1 and 510-2, shielding gradient coils 520-1 and 520-2, etc. The gradient coil assembly 500 may be flat-shaped, cylinder-shaped, etc. For example, a stereochemical structure diagram of the gradient coil assembly 500 may be as the embodiment shown in FIG. 3. The primary gradient coils 310 may correspond to the primary gradient coils 510-1 and 510-2 respectively. The shielding gradient coils 320 may correspond to the shielding gradient coils 520-1 and 520-2. That is, the gradient coil assembly m500 may be cylinder-shaped. The primary gradient coils 510-1 and 510-2, and the shielding gradient coils 520-1 and 520-2 may be arranged co-axially along the axis of the bore formed by the maim magnet. In some embodiments, the primary gradient coils 510-1 and 510-2 may be arranged to conform to the side wall of a cylindrical shape, thereby forming a first accommodating cavity. The shielding gradient coils 520-1 and 520-2 may be similarly arranged to form a second accommodating cavity. The first accommodating cavity may be within the second accommodating cavity. The shielding gradient coil 520-1 may be peripheral to the primary gradient coil 510-1 in reference to the axis of the bore formed by the main magnet. That is, the primary gradient coil 510-1 may be arranged on an inner side of the shielding gradient coil 520-1 and be closer to the axis of the bore. The shielding gradient coil 520-2 may be peripheral to the primary gradient coil 510-2 in reference to the axis of the bore formed by the main magnet. That is, the primary gradient coil 510-2 may be arranged on an inner side of the shielding gradient coil 520-2 and be closer to the axis of the bore.

Each of the primary gradient coils 510-1 and 510-2 may include two coil layers each including one or more coil units. As shown in FIG. 5, the primary gradient coil 510-1 or 510-2 may include two coil layers each including a single coil unit. It should be noted that a coil layer of the primary gradient coil 510-1 or 510-2 may include two or more coil units that are wound along different coil paths, which is not limited herein. More descriptions regarding the coil layers and coil units may be found in the following descriptions of the shielding gradient coils 520-1 and 520-2.

Figure 7:
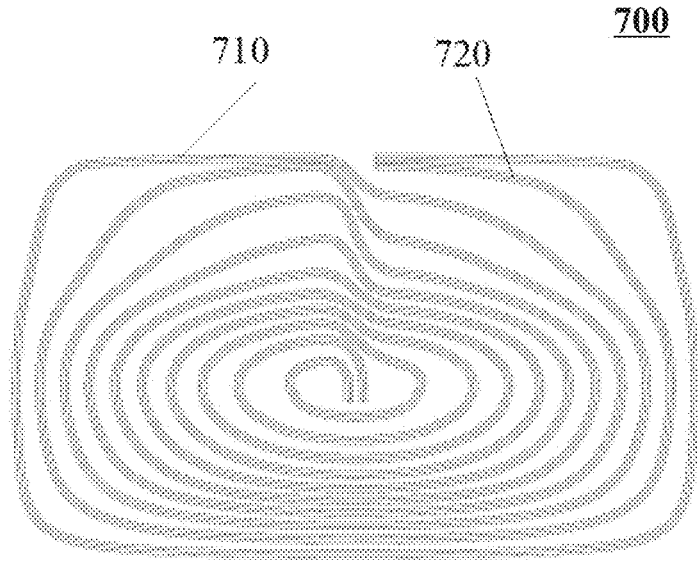
Figure 8:
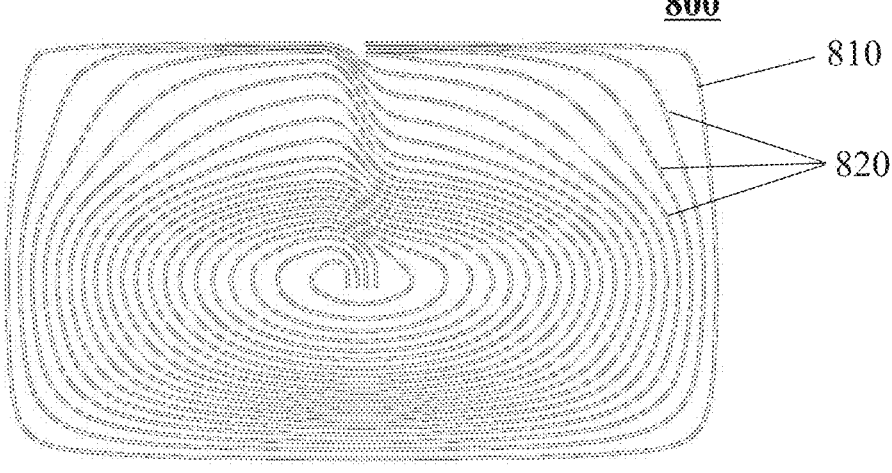
Figure 9:
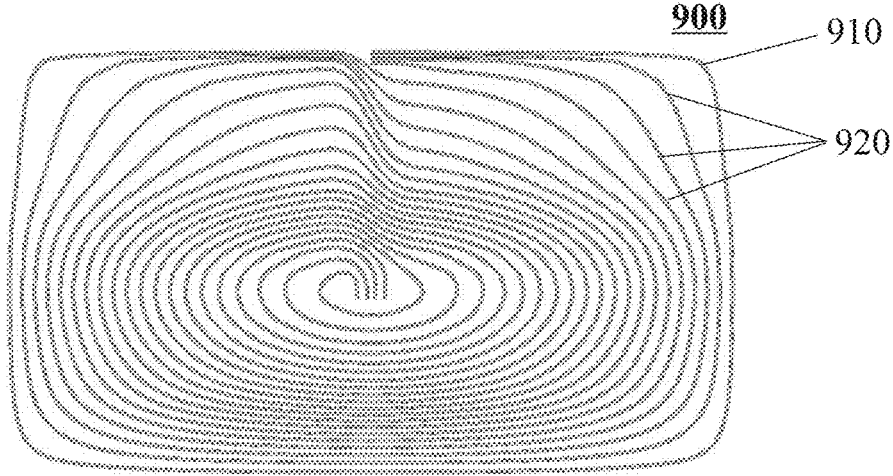

Each of the shielding gradient coils 520-1 and 520-2 may include two coil layers each including two or more coil units that are wound along different coil paths. The two or more coil units of a coil layer may include an inner coil unit wound along an inner coil path, and an outer coil path wound along an outer coil path. As used herein, an outer coil unit of a coil layer refers to an outermost coil unit of the coil layer, and an inner coil unit of the coil layer refers to any coil unit of the coil layer except for the outermost coil unit. In some embodiments, a count of the two or more coil units of a coil layer may be even (e.g., 2, 4, 6, 8, etc.). That is, a coil layer may correspond to even coil paths. For example, the coil layer (e.g., the first coil layer or the second coil layer) may include two coil units corresponding to two coil paths, as shown in FIGS. 6 and 7. For instance, the coil layer 700 may include an inner coil unit 720 and an outer coil unit 710. As another example, the coil layer may include four coil units corresponding to four coil paths as shown in FIGS. 8 and 9. For example, the coil layer 800 may include three inner coil units 820 and an outer coil unit 810. As another example, the coil layer 900 may include three inner coil units 920 and an outer coil unit 910. In some embodiments, for a shielding gradient coil (e.g., the shieling gradient coil 520-1 or 520-2) including a first coil layer and a second coil layer, a count (or the number) of coil units in the first coil layer may be the same as a count (or the number) of coil units in the second coil layer. For example, if the first coil layer includes two coil units, the second coil layer may also include two coil units. As another example, if the first coil layer includes four coil units, the second coil layer may also include four coil units.

In some embodiments, one of the two or more coil units may be wound along a first coil path (e.g., an inner coil path); another one of the two or more coil units may be wound along a second coil path (e.g., an outer coil path). As shown in FIG. 5, the shielding gradient coil 520-1 may include a first coil layer and a second coil layer. The first coil layer may include a first inner coil unit 522 and a first outer coil unit 521. The second coil layer may include a second inner coil unit 524 and a second outer coil unit 523. The first inner coil unit 522 and the second inner coil unit 524 may be wound along an inner coil path. The first outer coil unit 521 and the second outer coil unit 523 may be wound along an outer coil path. The first inner coil unit 522 and the second coil unit 524 may be denoted by dotted lines. The first outer coil unit 521 and the second outer coil unit 523 may be denoted by solid lines. The inner coil path may be different from the outer coil path. That is, the inner coil path may not overlap with the outer coil path. For example, an end of the inner coil path extending to a center of the first coil layer may be close to and not overlap with an end of the outer coil path extending to the center of the first coil layer. An end of the inner coil path at an edge of the first coil layer may be close to and not overlap with an end of the outer coil path at the edge of the first coil layer. As another example, a first middle trajectory (i.e., a portion between two ends) of the inner coil path may be not close or adjacent to a second middle trajectory (e.g., a portion between two ends) of the outer coil path of the same coil layer as the inner coil path. That is, there may be a distance (e.g., greater than a preset distance) between the first middle trajectory and the second middle trajectory. In some embodiments, coil units in a same coil layer may be connected in parallel. For example, the outer coil unit 521 and the inner coil unit 522 of the first coil layer may be connected in parallel. As another example, the outer coil unit 523 and the inner coil unit 524 of the second coil layer may be connected in parallel.

In some embodiments, the first coil layer and the second layer of the shielding gradient coil 520-1 may be arranged to form a single plane, e.g., as shown in FIG. 3, which may simplify the structure of the gradient coil assembly 500. Alternatively, the first coil layer and the second layer of the shielding gradient coil 520-1 may be arranged to form two parallel planes. As used herein, the term "plane" refers either a surface that is either flat or conforms to a curved side surface of a cylinder. For example, the first coil layer may be closer to the axis of the bore formed by the main magnet than the second coil layer. In such cases, conductors of the first coil layer and conductors of the second coil layer may be staggered, such that the gradient coil assembly 500 may produce gradient fields in different directions, so as to meet different gradient performance needs of the gradient coil assembly 500.

Figure 10:
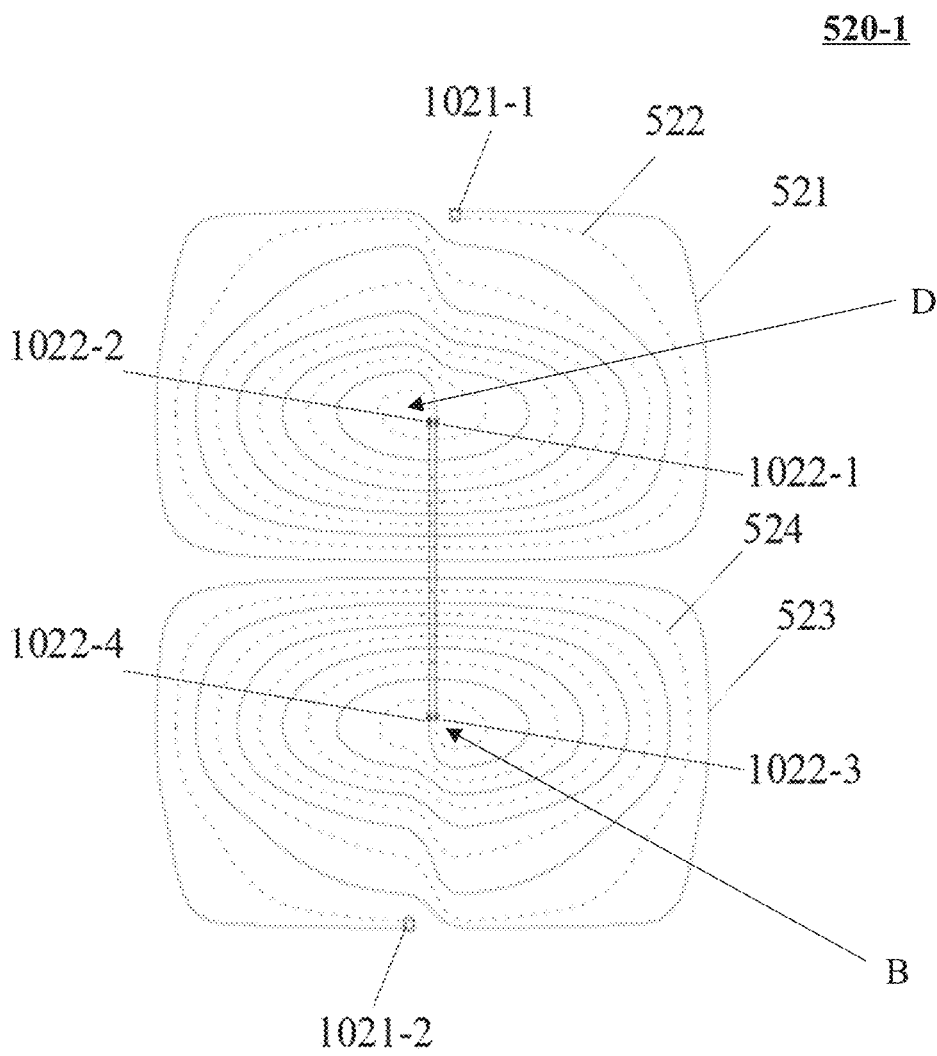
FIG. 10 is a schematic diagram illustrating an exemplary gradient coil assembly according to some embodiments of the present disclosure.

In some embodiments, the first coil layer of the shielding gradient coil 520-1 may be electrically connected with the second coil layer of the shielding gradient coil 520-1. For example, the first coil layer and the second coil of the shielding gradient coil 520-1 may be connected in series. As shown in FIG. 10, the first inner coil unit 522 of the first coil layer may include a first end 1022-1 extending to a center D of the first coil layer. The first outer coil unit 521 may include a second end 1022-2 extending to the center D of the first coil layer. The second inner coil unit 524 may include a third end 1022-3 extending to a center B of the second coil layer. The second outer coil unit 523 may include a fourth end 1022-4 extending to the center B of the second coil layer. The first inner coil unit 522 may be electrically connected with the second outer coil unit 523 by electrically connecting the first end 1022-1 and the fourth end 1022-4. The first outer coil unit 521 may be electrically connected with the second inner coil unit 524 by electrically connecting the second end 1022-2 and the third end 1022-3. In some embodiments, the first end 1022-1 and the fourth end 1022-4 may be electrically connected by a twisted connection, a compression connection, a welding connection, etc. The second end 1022-2 and the third end 1022-3 may be electrically connected by a twisted connection, a compression connection, a welding connection, etc. Accordingly, the first coil layer of the shielding gradient coil 520-1 may be electrically connected with the second coil layer of the shielding gradient coil 520-1. By such a layered structure design, the overall volume of the gradient coil assembly 500 may be reduced and the overall inductance quantity of the gradient coil assembly 500 may be increased.

In some embodiments, the first inner coil unit 522 may include a fifth end (not shown) at the edge of the first coil layer. The first outer coil unit 521 may include a sixth end (not shown) at the edge of the first coil layer. The second inner coil unit 524 may include a seventh end (not shown) at an edge of the second coil layer. The second outer coil unit 523 may include an eighth end (not shown) at the edge of the second coil layer. The fifth end and the sixth end may be packaged as a first interface 1021-1 (e.g., by welding). The seventh end and the eighth end may be packaged as a second interface 1021-2. That is, for a coil layer, ends of coil units (or conductors of the coil units) of the coil layer at an edge of the coil layer may be packaged to an interface. In such cases, different coil units of the same coil layer (e.g., the first inner coil unit 522 and the first outer coil unit 521 of the first coil layer) may be connected with a same driver source (e.g., a current source/supply 530 as shown). In addition, a total resistance of the first outer coil unit 521 and the second inner coil unit 524 may be equal to a total resistance of the first inner coil unit 522 and the second outer coil unit 523.

In some embodiments, each coil unit (e.g., the first inner coil unit 522, the first outer coil unit 521, the second coil inner unit 524, the second outer coil unit 523, a coil unit of the primary gradient coil 510-1 or 520-1, etc.) may include one or more conductors (e.g., conducting wires) wound along a same coil path. For example, the first inner coil unit 522 may include a single conductor, the first outer coil unit 521 may include a single conductor. As another example, the first inner coil unit 522 may include two or more conductors, and the second outer coil unit 521 may include two or more conductors. As still another example, each coil unit of the coil layer 700 or 900 may include a plurality of entangled and wound conductors. As a further example, each coil unit of the coil layer 800 may include two conductors that are wound along a coil path in parallel.

FIG. 6 illustrates an exemplary first coil layer of the shielding gradient coil 520-1 according to some embodiments of the present disclosure. The first coil layer 600 may include an inner coil unit (including a first inner conductor 614 and a first outer conductor 613) and an outer coil unit (including a second inner conductor 612 and a second outer conductor 611). The first inner conductor 614 and the first outer conductor 613 may be co-wound along an inner coil path (in reference to a center of the first coil layer). The second inner conductor 612 and the second outer conductor 611 may be co-wound along an outer coil path (in reference to a center of the first coil layer 600). An end of the first inner conductor 614 extending to a center of the first coil layer 600 may be electrically connected with an end of the first outer conductor 613 extending to a center of the first coil layer 600 (e.g., by welding). An end of the second inner conductor 612 extending to a center of the first coil layer 600 may be electrically connected with an end of the second outer conductor 611 extending to the center of the first coil layer 600 (e.g., by welding). An end of the first inner conductor 614 at an edge of the first coil layer 600 may be electrically connected with an end of the first outer conductor 613 at the edge of the first coil layer 600 (e.g., by welding) to form an edge end of the inner coil unit of the first coil layer 600. An end of the second outer conductor 611 at the edge of the first coil layer 600 may be electrically connected with an end of the second inner conductor 612 at the edge of the first coil layer 600 (e.g., by welding) to form an edge end of the outer coil unit of the first coil layer. The edge end of the inner coil unit and the edge end of the outer coil unit may be packaged as an interface (e.g., the first interface 1021-1). It should be noted that the first coil layer 600 may include more than two coil units (or correspond to more than two coil paths) as shown in FIG. 6, and/or each coil unit of the first coil layer 600 may include a single conductor or more than two (e.g., 3, 4, 5, etc.) conductors, which is not limited herein. By increasing a count (or the number) of conductors of the coil unit, the skin effect corresponding to the coil unit may be reduced. As used herein, the skin effect refers to an effect characteristic of current distribution in a conductor at high frequencies by virtue of which the current is greater near the surface of the conductor than in its interior resulting in an increase of resistance with increasing frequency.

In some embodiments, the primary gradient coils 510-1 and 510-2 may be electrically connected with the shielding gradient coils 520-1 and 520-2. As shown in FIG. 5, the primary gradient coils 510-1 may include interfaces 531 and 532. The primary gradient coils may include interfaces 533 and 534. The shielding gradient coil 520-1 may include interfaces 535 and 536. The shielding gradient coils 520-2 may include interfaces 537 and 538. The primary gradient coils 510-1 and 510-2 may be connected with a current supply/power 530 by connecting the current supply 530 with the interface 531 and the interface 533. The shielding gradient coil 520-1 may be electrically connected with the shielding gradient coil 520-2 by connecting the interface 535 and the interface 537. The primary gradient coil 510-1 may be electrically connected with the shielding gradient coil 520-1 by connecting the interface 532 and the interface 537. The primary gradient coil 510-2 may be electrically connected with the shielding gradient coil 520-2 by connecting the interface 534 and the interface 538.

According to the design that a coil layer of a shielding gradient coil includes two or more coil units wound along two or more coil paths, a current flowing through each of the two or more coil units may be the same. For example, assuming that the coil layer includes only a coil unit wound along a coil path and driven by a current source (denoted by S), a current flowing through the coil unit may be denoted by I. According to some embodiments of the present disclosure, the coil layer may include two coil units wound along two different coil paths. When the coil layer including the two coil units is driven by the current source S, a current flowing through each of the two coil units may be denoted by I/2 (i.e., a half of I), which helps the shielding gradient coil to form a homogeneous shielding magnetic field. In some embodiments, to improve the shielding effect of the shielding gradient coil, it usually increases the winding density (e.g., winding turns) of the shielding gradient coil and the main shielding coil of the gradient coil assembly, which may improve (e.g., increase) the shielding effect. However, in such cases, the intensity of the effective gradient field may be reduced (as the shielding field generated by the shielded gradient coil may inhibit the main gradient field generated by the main gradient coil). According to the arrangement of a first coil path and a second coil path in a coil layer, the shielding effect may be improved/increased without affecting the intensity of the effective gradient field. In addition, the design of increasing the winding turns of the shielding gradient coil may need a strong (large) current which may result in coil heating, while the design of two different coil paths may reduce a current flowing through a single coil unit wound along a coil path, thereby reducing the intensity of the dissipating gradient magnetic field (i.e., the dissipated field) outside the gradient coil assembly 500 and improving the working hours and the stability of the gradient coil assembly, and reducing a cooling need of the gradient coil assembly. For example, according to a simulation computing, a maximum dissipated field corresponding to the design of a single coil path may be 8.68 mT at a specific position outside the gradient coil assembly, while a maximum dissipated field corresponding to the design of two coil paths may be 6.31 mT at the specific position, which indicates that the design of two coil paths may reduce the dissipated field by 27.3%, thereby reducing the heat generated by eddy current which is generated by the dissipated field by 47.1%.

It should be noted that the above description regarding the gradient coil assembly is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the gradient coil assembly 500 may include more than two primary gradient coils and/or more than two shielding gradient coils. In some embodiments, the first coil path may correspond to a first driver source, and the second coil path may correspond to a second driver source different from the first driver source. For example, the first inner coil unit 522 wound along the first coil path may be connected with the first driver source, and the first outer coil unit 521 wound along the second coil path may be connected with the second driver source.

Figure 11:
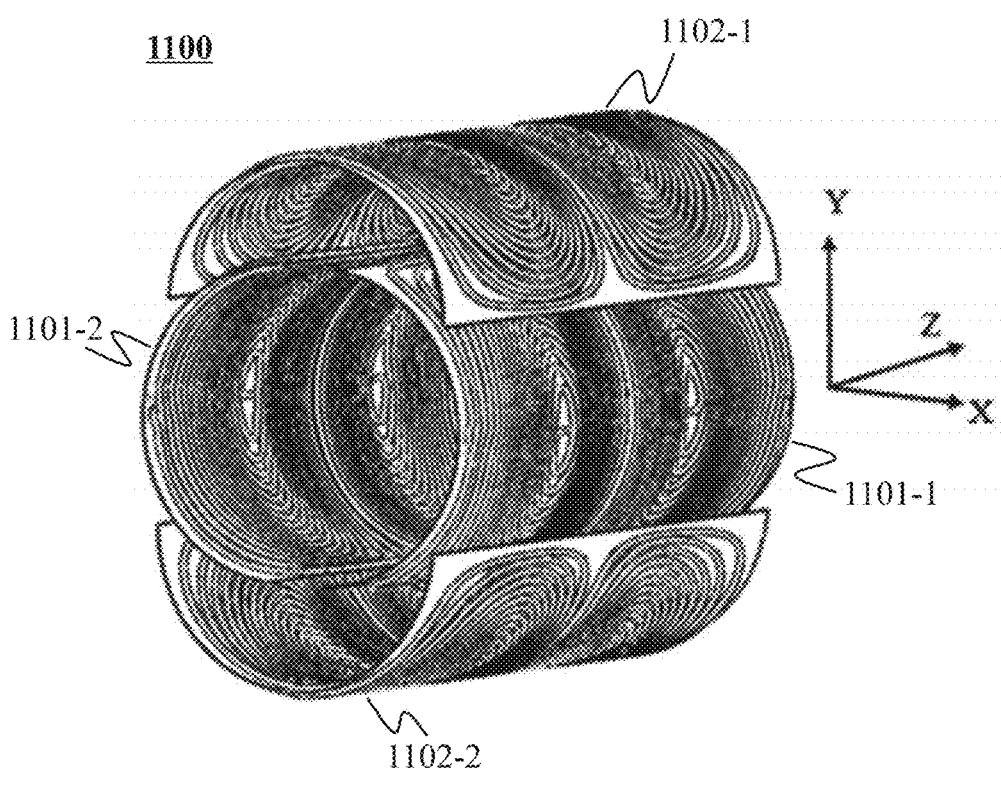
FIG. 11 is a schematic diagram illustrating an exemplary gradient coil assembly according to some embodiments of the present disclosure.

FIG. 11 is a partial explosive structure diagram illustrating an exemplary gradient coil assembly according to some embodiments of the present disclosure. As shown in FIG. 11, the gradient coil assembly 1100 may include primary gradient coils 1101-1 and 1101-2 and shielding gradient coils 1102-1 and 1102-2. The shielding gradient coils 1102-1 and 1102-2 may be peripheral to the primary gradient coils 1101-1 and 1101-2. The primary gradient coils 1101-1 and 1101-2 and the shielding gradient coils 1102-1 and 1102-2 may be saddle coils. The primary gradient coils 1101-1 and 1101-2 may be X coils. The shielding gradient coils 1102-1 and 1102-2 may be Y coils. The shielding gradient coil 1102-1 or 1102-2 may include two coil layers that are electrically connected, which is the same as or similar to the structure of the shielding gradient coil 520-1 or 520-2 as described in FIG. 5. Coil layers of the primary gradient coils 1101-1 and 1101-2 and the shielding gradient coils 1102-1 and 1102-2 may be constituted to form a whole structure of the gradient coil assembly 1100. For example, the coil layers of the primary gradient coils 1101-1 and 1101-2 and the shielding gradient coils 1102-1 and 1102-2 may be rolled, by a plate winding machine, into cylindrical structures of different sizes. The rolled coil layers of the primary gradient coils 1101-1 and 1101-2 and the shielding gradient coils 1102-1 and 1102-2 may be assembled co-axially. Further, the assembled coil layers may be encapsulated by epoxy resin liquid, which may isolate the air and achieve a target of moisture-proof, water-proof, oil-proof, dust-proof, heat resistance, and aging resistance, thereby forming the gradient coil assembly 1100.

In some embodiments, a coil layer of the primary gradient coil 1101-1, the primary gradient coil 1101-2, the shielding gradient coil 1102-1, or the shielding gradient coil 1102-2 may include two or more coil units wound along two or more different coil paths, which is similar to the coil layer of the shielding gradient 520-1 as described in FIG. 5, which can reduce the overall volume of the gradient coil assembly 1100 and increase the overall inductance quantity of the gradient coil assembly 1100. According to such a design of two or more coil paths, a current of the shielding gradient coil 1102-1 or 1102-2 may be divided into multiple current paths for transmission, which may increase the current distribution in the shielding gradient coil, reduce the intensity of the dissipating gradient magnetic field (i.e., the dissipated field) outside the gradient coil assembly 1100, and ensure the stability and working hours of the magnetic field generated by an MRI system/device. In addition, according to the design of two or more coil paths, the heating problem of the primary gradient coils 1101-1 and 1101-2 and the shielding gradient coils 1102-1 or 1102-2 may be reduced to some extent, thus reducing the damage rate of the gradient coil assembly 1100 and extending the service life of gradient coil assembly 1100.

Figure 12:
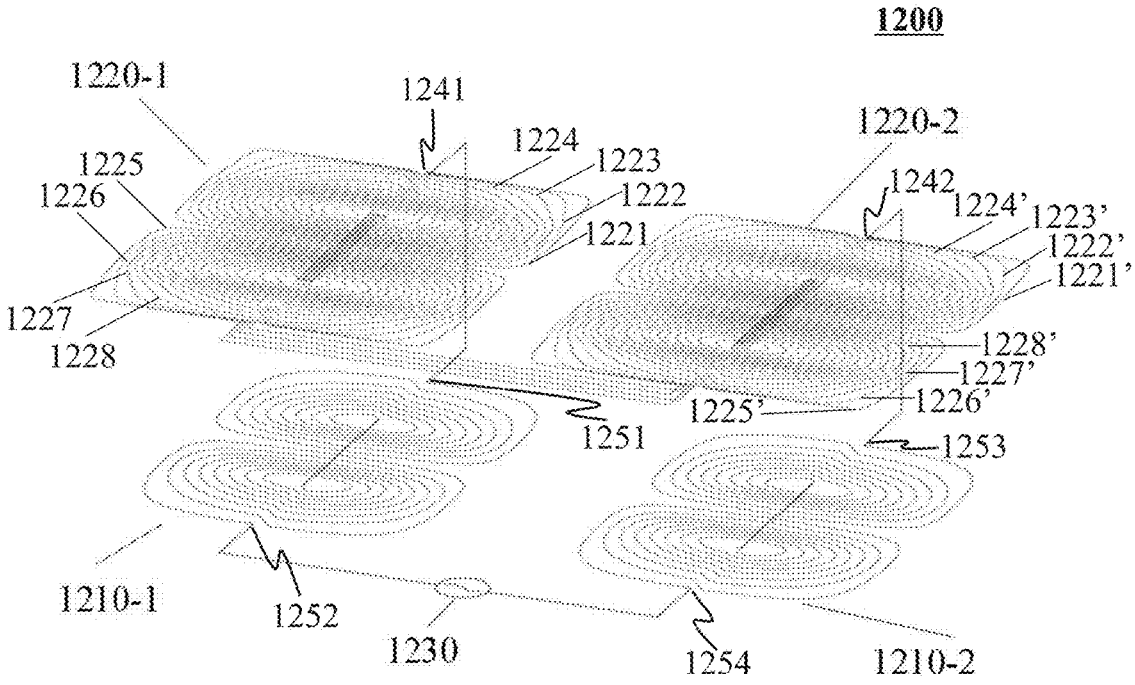
FIG. 12 is a schematic diagram illustrating an exemplary gradient coil assembly according to some embodiments of the present disclosure.
Figure 21:
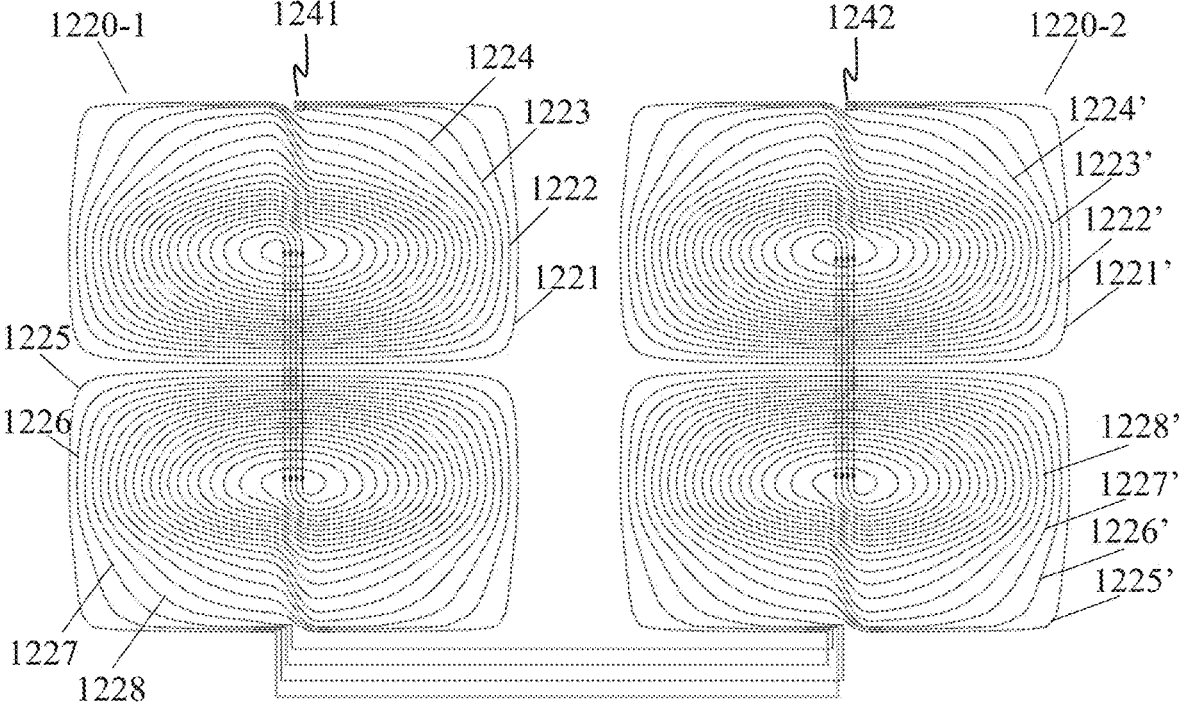
FIG. 21 is a schematic diagram illustrating an enlarged view of shielding coils in FIG. 20 according to some embodiments of the present disclosure.

FIG. 12 is a schematic diagram illustrating an exemplary gradient coil assembly according to some embodiments of the present disclosure. FIG. 12 is in a plane expansion view of the gradient coil assembly 1200. The gradient coil assembly 1200 may include primary gradient coils 1210-1 and 1210-2 and shielding gradient coils 1220-1 and 1220-2, which may be arranged or assembled similarly to the primary gradient coils 510-1 and 510-2 and the shielding gradient coils 520-1 and 520-2 of the gradient coil assembly 500 as described in FIG. 5. The primary gradient coil 1210-1 or 1210-2 may correspond to a single coil path, The shielding gradient coil 1220-1 or 1220-2 may correspond to four coil paths. The shielding gradient coil 1220-1 or 1220-2 may include two coil layers that are electrically connected, similar to the two coils layers of the shielding gradient coils 510-1 or 510-2 as shown in FIG. 5. For example, the shielding gradient coil 1220-1 may include a first coil layer and a second coil layer. The first coil layer of the shielding gradient coil 1220-1 may include an outer coil unit 1221 and three inner coil units 1222, 1223, and 1224. The second coil layer of the shielding gradient coil 1220-1 may include an outer coil unit 1225 and three inner coil units 1226, 1227, and 1228. An end of the outer coil unit 1221 extending to a center of the first coil layer may be electrically connected with an end of the inner coil unit 1228 extending to a center of the second coil layer. An end of the inner coil unit 1222 extending to the center of the first coil layer may be electrically connected with an end of the inner coil unit 1227 extending to the second of the second coil layer. An end of the inner coil unit 1223 extending to the center of the first coil layer may be electrically connected with an end of the inner coil unit 1226 extending to the second of the second coil layer. An end of the inner coil unit 1224 extending to the center of the first coil layer may be electrically connected with an end of the outer coil unit 1225 extending to the second of the second coil layer. Ends of the coil units 1221-1224 of the first coil layer at an edge of the first coil layer may be packaged as an interface 1241, and ends of the coil units 1225-1228 may be packaged individually. Similarly, the shielding gradient coil 1220-2 may include a first layer (including an outer coil unit 1221' and three inner coil units 1222', 1223' and 1224') and a second layer (including an outer coil unit 1225' and three inner coil units 1226', 1227' and 1228'). Ends of coil units 1221'-1224' at an edge of the first coil layer of the shielding gradient coil 1220-2 may be packaged as an interface 1242, and ends of coil units 1225'-1228' at an edge of the second coil layer of the shielding gradient coil 1220-2 may be packaged individually. The primary gradient coil 1210-1 may include two ends 1251 and 1252 as shown in FIG. 12. The primary gradient coil 1210-2 may include two ends 1253 and 1254 as shown in FIG. 12. The shielding gradient coil 1220-1 may be electrically connected with the primary gradient coil 1210-1 by connecting the interface 1241 and the end 1251 of the primary gradient coil 1210-1. The shielding gradient coil 1220-2 may be electrically connected with the primary gradient coil 1210-2 by connecting the interface 1242 and the end 1253 of the primary gradient coil 1210-2. The primary gradient coil 1210-1 and the primary gradient coil 1210-2 may be connected to a current source 1230. FIG. 21 is an enlarged view of the connection between the shieling gradient coils 1220-1 and 1220-2. As shown in FIG. 21, an end of the outer coil unit 1225 at the edge of the second layer of the shielding gradient coil 1220-1 may be electrically connected with an end of the inner coil unit 1227' at the edge of the second layer of the shielding gradient coil 1220-2. An end of the inner coil unit 1226 at the edge of the second layer of the shielding gradient coil 1210-1 may be electrically connected with an end of the outer coil unit 1228' at the edge of the second layer of the shielding gradient coil 1220-2. An end of the inner coil unit 1227 at the edge of the second layer of the shielding gradient coil 1210-1 may be electrically connected with an end of the outer coil unit 1225' at the edge of the second layer of the shielding gradient coil 1220-2. An end of the inner coil unit 1228 at the edge of the second layer of the shielding gradient coil 1210-1 may be electrically connected with an end of the outer coil unit 1226' at the edge of the second layer of the shielding gradient coil 1220-2. Accordingly, the shielding gradient coil 1220-1 may be electrically connected with the shielding gradient coil 1220-2. In such cases, a first total resistance of the outer coil unit 1221, the inner coil unit 1228, the inner coil unit 1226', and the inner coil unit 1223', a second total resistance of the inner coil unit 1222, the inner coil unit 1227, the outer coil unit 1225', and the inner coil unit 1224', a third total resistance of the inner coil unit 1223, the inner coil unit 1226, the inner coil unit 1228', and the outer coil unit 1221', and a fourth total resistance of the inner coil unit 1224, the outer coil unit 1225, an inner coil unit 1227', and the inner coil unit 1222' may be equal to each other.

Figure 14:
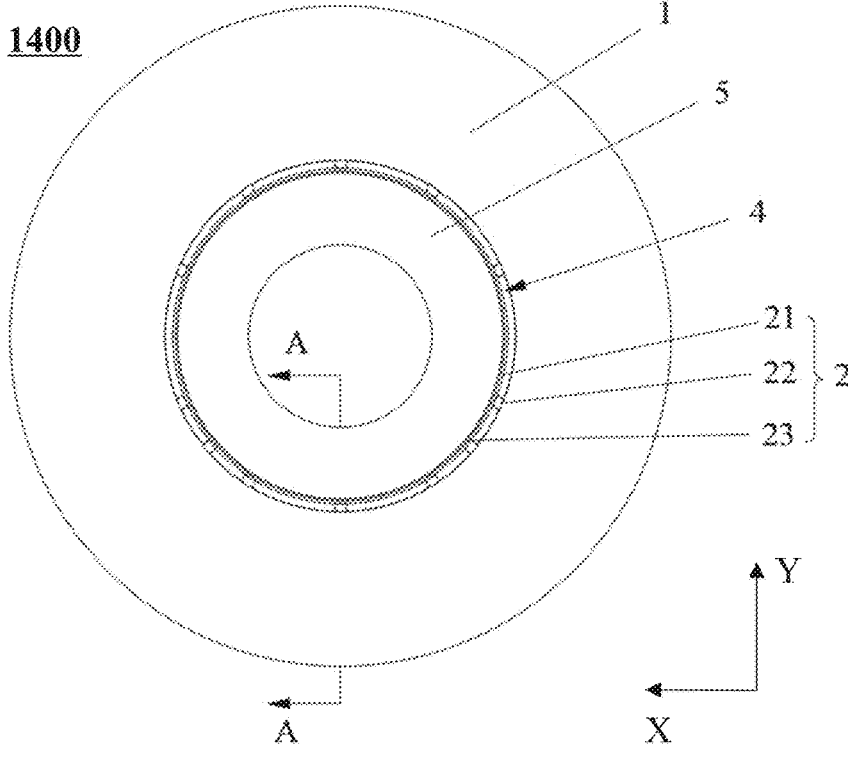
FIGS. 14-16 are schematic diagrams illustrating an exemplary superconducting magnet device according to some embodiments of the present disclosure.
Figure 15:
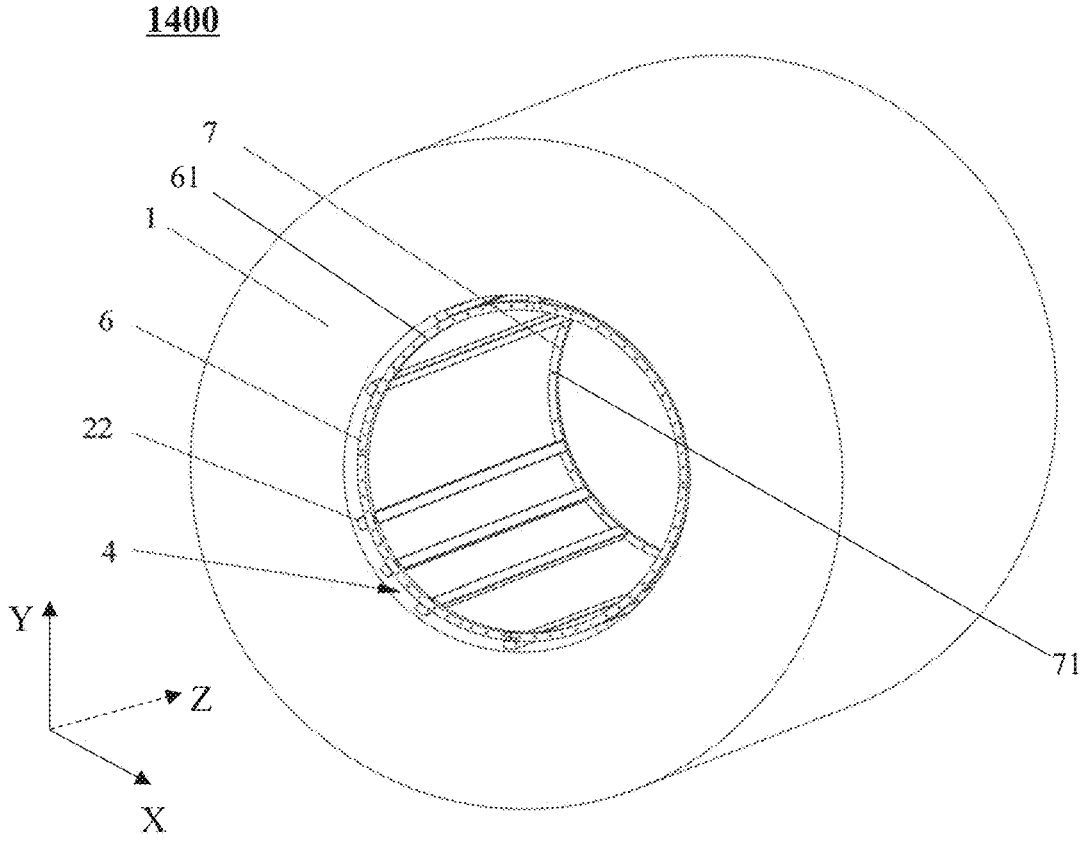
Figure 16:
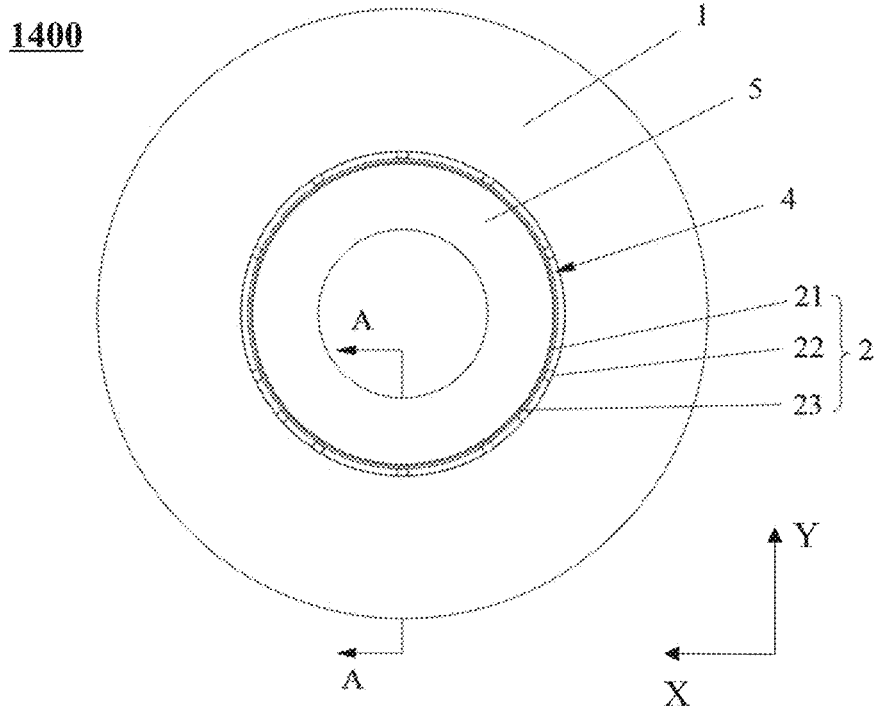
Figure 17:
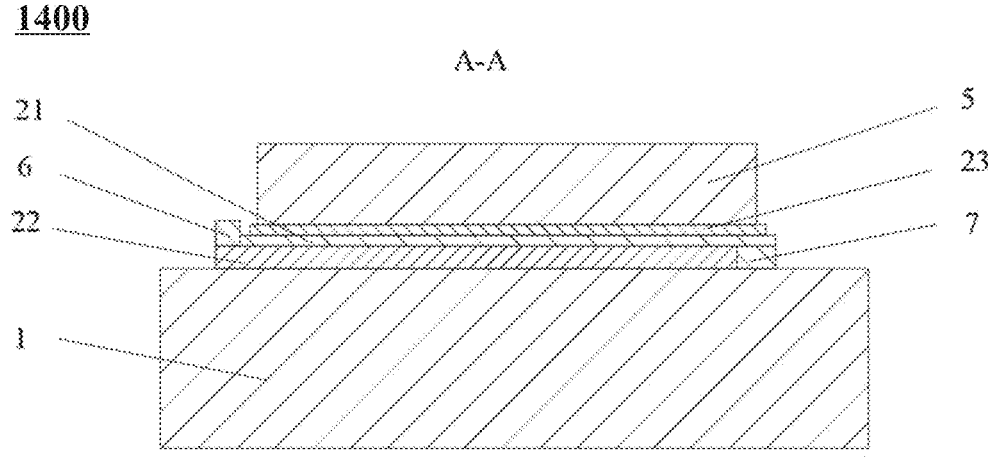
FIG. 17 is a schematic diagram illustrating an exemplary A-A section view of the superconducting magnet device in FIG. 16 according to some embodiments of the present disclosure.
Figure 18:
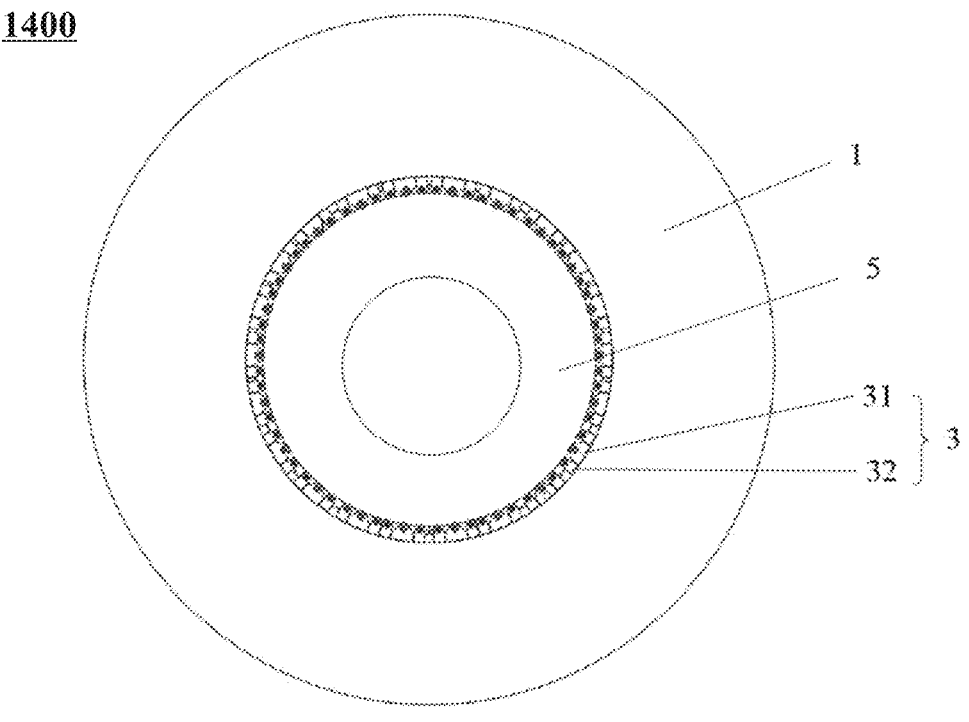
FIG. 18 is a schematic diagram illustrating an exemplary superconducting magnet device according to some embodiments of the present disclosure.

FIGS. 14-16 and 18 are schematic diagrams illustrating an exemplary superconducting magnet device according to some embodiments of the present disclosure. FIG. 14 is in an end view of the superconducting magnet device 1400 facing the XY plane when a shimming unit is not assembled or mounted. FIG. 16 is in the end view of the superconducting magnet device 1400 when a first end-ring is not assembled or mounted. FIG. 17 is an A-A section view of FIG. 16. FIG. 18 is an end view of the superconducting magnet device 1400. As shown in FIGS. 14-18, the superconducting magnet device 1400 may include a superconducting magnet 1, a gradient coil assembly 5 (which is the same as or similar to the gradient coil assembly 500, 1100, or 1200), a shimming structure including a support unit 2 and a shimming unit 3, or the like, or any combination thereof. In some embodiments, the superconducting magnet device 1400 may be a portion of an MRI system or an MRI scanner thereof (e.g., the MRI system 100 or the MRI scanner 110 as shown in FIG. 1 and/or FIG. 2). The MRI system or the MRI scanner may include the superconducting magnet 1, the gradient coil assembly 5, and the shimming structure including the support unit 2 and the shimming unit 3.

The superconducting magnet 1 may form a bore that has an axis parallel to the Z axis (e.g., the axis 210). For example, the superconducting magnet 1 may include a cryogenic container and superconducting coils in the cryogenic container. The superconducting coils may be supported by a supporting part (e.g., a bracket) and arranged in the cryogenic container. The cryogenic container may be arranged to conform to the side wall of a cylindrical shape, thereby forming the bore. The gradient coil assembly 5 and the shimming structure (e.g., the support unit 2 and the shimming unit 3) may be arranged in the bore. For example, the support unit 2 may be arranged to surround the bore and positioned between the gradient coil assembly 5 and the superconducting magnet 1. At least one accommodating cavity 4 may be formed between the support unit 2 and the superconducting magnet 1 (e.g., between an outer wall of the support unit 2 away from the axis of the bore and an inner wall of the superconducting magnet 1). As used herein, an inner wall of the superconducting magnet 1 refers to a surface of the superconducting magnet 1 that is close to the axis of the bore. The gradient coil assembly 5 may be arranged in the inner wall of the support unit 2. The shimming unit 3 may be arranged in the at least one accommodating cavity 4. The gradient coil assembly 5 may be configured to support the shimming unit 3 and/or the gradient coil assembly 5. In some embodiments, the superconducting magnet 1, the support unit 2, and the gradient coil assembly 5 may be cylinder-shaped and arranged co-axially (e.g., around the axis of the bore).

According to the above design of the superconducting magnet device 1400, the shimming unit 3 may be arranged between the superconducting magnet 1 and the gradient coil assembly 5 by the support unit 2, in which cases a vibration generated by the gradient coil assembly 5 during working may be not directly transmitted to the shimming unit 3, which may improve the stability of the shimming unit 3, which in turn improves the homogeneity and shimming stability of the main magnetic field generated by the superconducting magnet 1. In addition, the shimming unit 3 and the gradient coil assembly 5 may be separated by the support unit 2, in which cases the heat generated by the gradient coil assembly 5 may not be directly transmitted to the shimming unit 3, which may keep the stability of magnetic permeability of the shimming unit 3 and further improve and/or ensure the shimming stability. As the magnetic field generated by the superconducting magnet device 1400 has improved homogeneity and stability, the superconducting magnet device 1400 may be assembled/set in an MRI device (e.g., the MRI scanner 110), which may ensure the MRI device performing a scan stably and having well imaging quality.

In some embodiments, the gradient coil assembly 5 may be configured to include one or more cooling channels. During the operation of the gradient coil assembly 5, coolant may be circulated into the one or more cooling channels for cooling the gradient coil assembly 5. In some embodiments, the one or more cooling channels may be set on a surface of the gradient coil assembly 5 facing the support unit 2, which may further reduce the transmission of the heat generated by the gradient coil assembly 2 to the shimming unit 3 and ensure the shimming stability of the shimming unit 3. In some embodiments, a cooling channel may be set as an annular channel wound on a surface (e.g., the outer wall) of the gradient coil assembly 5. The annular channel may be circulated into a cooling medium (i.e., coolant) including water, nitrogen, or the like, or any combination thereof. According to the design in the present disclosure, the gradient coil assembly 5 and the shimming unit 3 may be located on two sides of the support unit 2. Accordingly, the heat generated by the gradient coil assembly 5 may not be directly transmitted to the shimming unit 3, so that the permeability of the shimming unit 3 may remain stable, which further ensures the shimming stability of the homogenized field. By arranging the one or more cooling channels on a side where the gradient coil assembly 5 is in contact with the support unit 2, the transmission of the heat generated by the gradient coil assembly 5 to other surrounding components (e.g., the shimming unit 3) of the superconducting magnet device 1400 may be reduced.

As shown in FIGS. 14-16, the support unit 2 may include a support drum (or cylinder) 21 and a plurality of support bars 22. The support drum 21 may be arranged co-axially with the bore around the axis. The support drum 21 may be configured to support the gradient coil assembly 5. For example, the gradient coil assembly 5 may be supported on the inner wall of the support drum 21 close to the axis. The plurality of support bars 22 may be arranged around the axis and extend along (e.g., parallel to) the axis (i.e., the Z axis). The plurality of support bars 22 may be placed between and connected to an outer surface/wall of the support drum 21 and an inner surface of the superconducting magnet 1, such that the at least one accommodating cavity 4 may be formed between the support drum 21 and the superconducting magnet 1. In some embodiments, the shimming unit 3 may include multiple shimming bars. Each of the at least one accommodating cavity 4 may be configured to accommodate one or more shimming bars of the multiple shimming bars.

In some embodiments, a support bar of the plurality of support bars 22 may be an integrated strip or composed of multiple segments. In some embodiments, a support bar of the plurality of support bars 22 may be an integrated strip or composed of multiple segments. In some embodiments, the plurality of support bars 22 may be connected with the superconducting magnet 1 by a welding connection, a fasten connection, or the like, or any combination thereof. In some embodiments, the plurality of support bars 22 may be made of a metal material (e.g., stainless steel, aluminum, etc.), a high polymer material (e.g., epoxy resin, polyurethane, bakelite, etc.), an elastic material or damping material (e.g., spring steel, rubber, etc.), or the like, or any combination thereof. For example, the plurality of support bars 22 may be made of the elastic material, such that the plurality of support bars 22 may be deformed to absorb the vibration generated by the gradient coil assembly 5, which may further reduce the transmission of the vibration of the gradient coil assembly 5 to the shimming unit 3 and ensure the shimming stability of the shimming unit 3. As another example, the plurality of support bars 22 may be made of a metal material or a composite material. As another example, a support bar of the support bars 22 may be composed of multiple parts, and different parts may be made of different materials.

In some embodiments, the plurality of support bars 22 may be arranged along the circumferential direction of support drum 21 to support the support drum 21, such that the support drum 21 has better support stability to the gradient coil assembly 5. In some embodiments, the plurality of support bars 22 may be spaced apart along a circumferential direction of the support drum 21. In some embodiments, the plurality of support bars 22 may be uniformly arranged along a circumferential direction of the support drum 21. For example, the plurality of support bars 22 may be arranged/or distributed more densely in a region below the superconducting magnet 1 that is close to the ground than in other regions, to balance the gravity of gradient coil assembly 5 and ensure the support stability. Alternatively, the plurality of support bars 22 may be uniformly arranged along the circumferential direction of support drum 21, which is not limited here.

In some embodiments, as shown in FIGS. 14, 16, and 17, the support unit 2 may also include a damping mat 23. The damping mat 23 may be connected with the inner wall of the support drum 21, i.e., the damping mat 23 may be arranged between the gradient coil assembly 5 and support drum 21. The damping mat 23 may absorb the vibration of the gradient coil assembly 5, which may further reduce the transmission of the vibration of the gradient coil assembly 5 to the shimming unit 3. In some embodiments, the damping mat 23 may be made of an elastic material (e.g., rubber) which has a good damping effect. In some embodiments, the damping mat 23 may include a plurality of strip mats each of which extends along the axis of the bore (or the Z axis). The plurality of strip mats may be spaced apart along the circumferential direction of the support drum 21. Distributions or arrangements of the plurality of strip mats along the circumferential direction of the support drum 21 may be set according to actual situations. In some embodiments, the damping mat 23 may be integrated. For example, the damping mat 23 may include a cylinder structure. The damping mat 23 may cover the inner wall of the support drum 21, thereby reducing the transmission of the vibration of the gradient coil assembly 5 to the shimming unit 3.

Figure 19:
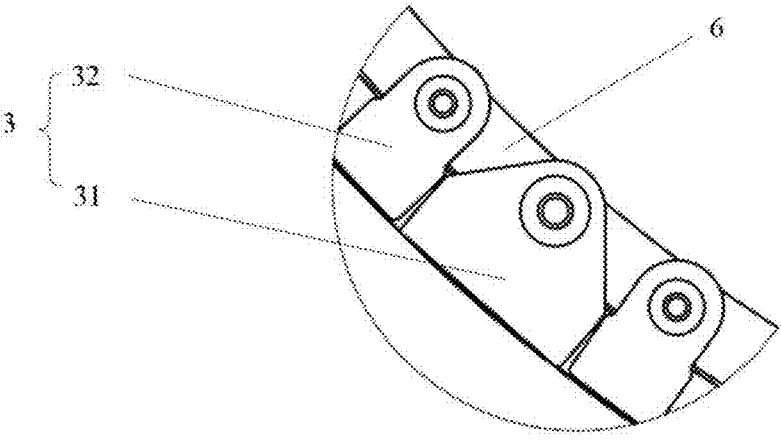
FIG. 19 is a schematic diagram illustrating an exemplary shimming unit according to some embodiments of the present disclosure.
Figure 20:
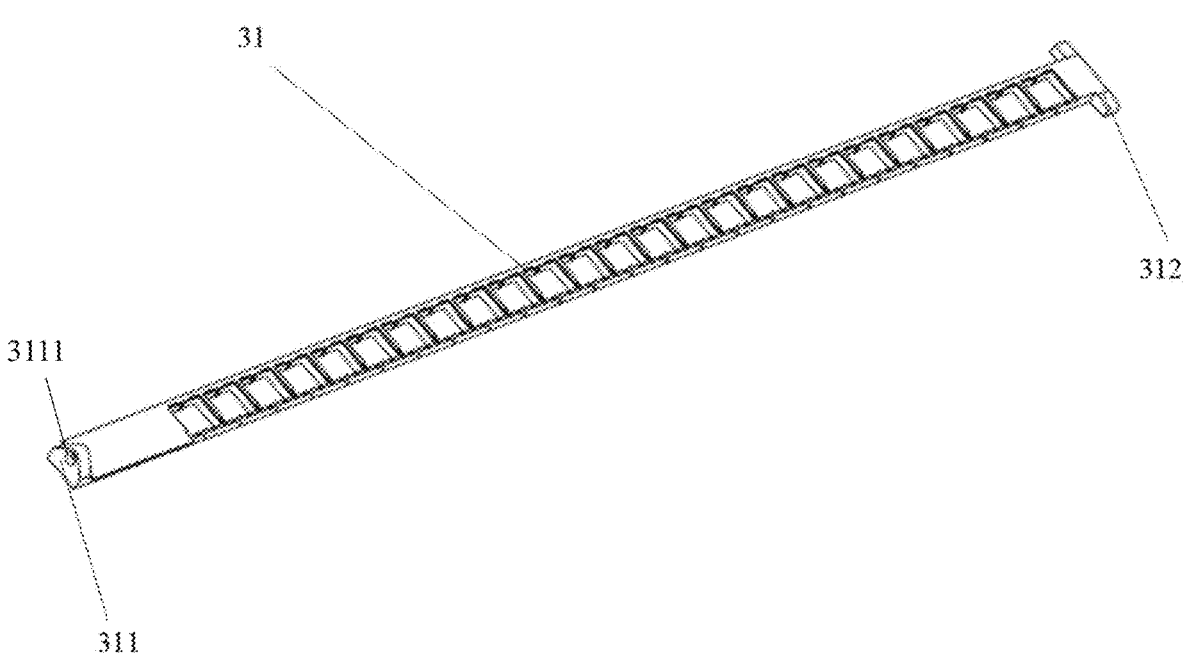
FIG. 20 is a schematic diagram illustrating an exemplary main shimming bar according to some embodiments of the present disclosure.

FIG. 19 is a schematic diagram illustrating an exemplary shimming unit of the superconducting magnet device 1400 as shown in FIG. 18. FIG. 20 is a schematic diagram illustrating an exemplary main shimming bar of the shimming unit 3 as shown in FIG. 18. As shown in FIGS. 18-20, the shimming unit 3 may include a plurality of main shimming bars 31 and a plurality of auxiliary shimming bars 32 that can accommodate magnetic substances. In some embodiments, shimming pieces that have different counts and/or surface areas from that of the auxiliary shimming bars 32 may be set in the plurality of main shimming bars 31, thereby forming shimming bars with different shimming effects, which can be combined flexibly to adjust the homogeneity of the magnetic field generated by the superconducting magnet 1. The shimming pieces set in the plurality of main shimming bars 31 and/or the plurality of auxiliary shimming bars 32 may be made of a ferro magnetic material (e.g., silicon steel, cobalt steel, etc.) In some embodiments, as shown, a width of a main shimming bar 31 along the circumferential direction of the superconducting magnet 1 may be greater than a width of an auxiliary shimming bar 32 along the circumferential direction of the superconducting magnet 1.

In some embodiments, the plurality of main shimming bars 31 may generate a relatively large magnetic field (e.g., larger than a preset magnetic field). The plurality of main shimming bars 31 may be mounted or assembled when the superconducting magnet 1 is not electrified and does not produce the main magnetic field. In some embodiments, the plurality of auxiliary shimming bars 32 may generate a relatively small magnetic field (e.g., smaller than the present magnetic field). The plurality of auxiliary shimming bars 32 may be mounted or assembled when the superconducting magnet 1 is producing the main magnetic field, such that the homogeneity of the main magnetic field may be adjusted to reach a desired homogeneity. In some embodiments, a length direction of the plurality of main shimming bars 31 and the plurality of auxiliary shimming bars 32 may be parallel to the axis of the support drum 21 (or the axis of the bore), and the plurality of main shimming bars 31 and the plurality of auxiliary shimming bars 32 may be arranged along the circumferential direction of the support drum 21 (or the superconducting magnet 1). In some embodiments, a main shimming bar 31 may be set between at least two auxiliary shimming bars 32. For example, as shown in FIG. 19, two auxiliary shimming bars 32 may be set on two sides of a main shimming bar 31, and the two auxiliary shimming bars 32 and the main shimming bar 31 may constitute a shimming bar set. An accommodating cavity 4 between two adjacent support bars 22 may be configured to accommodate one or more shimming bar sets, which may be determined according to actual situations.

In some embodiments, as shown in FIGS. 15 and 17, the superconducting magnet device 1400 may also include a first end-ring 6. The first end-ring may be connected to a first end of the support unit 2 and a first end of the shimming unit 3. The first end of the support unit 2 may be an end of the support unit 2 along a direction of the axis of the bore. The first end of the shimming unit 3 may be an end of the shimming unit 3 along a direction of the axis of the bore. After the shimming unit 3 is placed in the at least one accommodating cavity 4, the first end of the shimming unit 3 may be fixed with the first end-ring 6, such that the position of the shimming unit 3 may be fixed, avoiding the shimming unit 3 from moving in the at least one accommodating cavity 4. In some embodiments, the first end-ring 6 may be connected to the plurality of support bars 22 respectively. For example, the first end-ring 6 may be connected with an end of each support bar 22 along the direction of the axis of the bore. As another example, the first end-ring 6 may be connected with a side wall of a support bar 22 away from the superconducting magnet 1. Alternatively, the first end-ring 6 may be connected and fixed to the support drum 21. In some embodiments, the first end-ring 6 may be composed of multiple arc parts. Alternatively, the first end-ring 6 may be integrated.

In some embodiments, as shown in FIG. 15, the first end-ring 6 may be configured to include a plurality of mounting holes 61 along the circumferential direction of the first end-ring 6. An end of a main shimming bar 31 or an auxiliary shimming bar 32 may be configured to include a first connection part 311, as shown in FIG. 20. The first connection part 311 may be configured to include a connection through hole 3111. In real-world application, a first fastener may successively pass through a mounting hole 61 and the connection through hole 3111 of the first connection part 311 of a shimming bar (e.g., the main shimming bar 31 or the auxiliary shimming bar 32) to achieve fixing an end of the shimming bar, such that it is easy to assemble and disassemble the shimming bar for adjusting the homogeneity of the main magnetic field. In some embodiments, the first connection part 311 of the main shimming bar 31 may be connected to the first end-ring 6, while the auxiliary shimming bar 32 may not be connected to the first end-ring 6. The auxiliary shimming bar 32 may be fixed on the main shimming bar 31. It should be noted that the first end-ring 6 may be omitted, and the shimming unit 3 may be directly fixed in the gradient coil assembly 5 or the superconducting magnet 1 to achieve fixing the position of the shimming unit 3, which may be adjusted according to different situations.

In some embodiments, as shown in FIGS. 15 and 17, the superconducting magnet device 1400 may also include a second end-ring 7. The second end-ring 7 may be connected to a second end of the support unit 2 and a second end of the shimming unit 3. The second end of the support unit 2 may be another end of the support unit 2 along the direction of the axis of the bore in reference to the first end of the support unit 2. The second end of the shimming unit 3 may be another end of the shimming unit 3 along the direction of the axis of the bore in reference to the first end of the shimming unit 3. The first end-ring 6 and the second end ting 7 may be fixed on two ends of the shimming unit 3 respectively, such that the position of the shimming unit 3 may be stable in the at least one accommodating cavity 4. In some embodiments, the second end-ring 7 may be connected to the plurality of support bars 22 respectively. For example, the second end-ring 7 may be connected with an end of each support bar 22 along the direction of the axis of the bore. After the shimming unit 3 is placed in the at least one accommodating cavity 4, the end of each support bar 22 may be touched and connected to the second end-ring 7, such that the shimming unit 3 may be position limited. In some embodiments, the second end-ring 7 may be composed of multiple arc parts or be an integrated ring.

In some embodiments, the second end-ring 7 may be configured to include a plurality of mounting holes 71 along the circumferential direction of the second end-ring 7. Another end of a main shimming bar 31 or an auxiliary shimming bar 32 in reference to the end thereof that is configured to include the first connection part 311 may be configured to include a second connection part 312, as shown in FIG. 20. The second connection part 312 may be configured to include a counterbore (not shown). In real-world application, a second fastener may successively pass through a mounting hole 71 and a counterbore of the second connection part 312 of a shimming bar (e.g., the main shimming bar 31 or the auxiliary shimming bar 32) to achieve fixing another end of the shimming bar.

It should be noted that the above description regarding the superconducting magnet device 1400 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiment, the above-described design of the superconducting magnet device 1400 may be applied in other magnet device. For example, the magnet device may include a main/primary magnet (e.g., the main magnet 201 such as a permanent magnet) instead of the superconducting magnet 1. The shimming structure may be arranged between the main magnet and the gradient coil assembly 5.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A gradient coil assembly, comprising:
   a primary gradient coil and a shielding gradient coil, the primary gradient coil and the shielding gradient coil being arranged co-axially around an axis, and the shielding gradient coil being peripheral to the primary gradient coil in reference to the axis, wherein the shielding gradient coil includes two coil layers, each of the two coil layers includes two or more coil units, the two or more coil units of a same coil layer form one fingerprint shaped coil, and currents respectively corresponding to the two or more coil units are in parallel;
   one of the two or more coil units being wound along a first coil path;
   another one of the two or more coil units being wound along a second coil path; and
   the first coil path being different from the second coil path.

2. The gradient coil assembly of claim 1, wherein the two coil layers includes a first coil layer and a second coil layer, the first coil layer being electrically connected with the second coil layer.

3. The gradient coil assembly of claim 2, wherein the first coil layer and the second coil layer are arranged to form a single plane, or the first coil layer and the second coil layer are arranged to form two parallel planes.

4. The gradient coil assembly of claim 2, wherein the first coil path includes an inner coil path, and the second coil path includes an outer coil path,
   the first coil layer including a first inner coil unit and a first outer coil unit, wherein the first inner coil unit is one of the two or more coil units wound along the first coil path and the first outer coil unit is another of the two or more coil units wound along the second coil path; and
   the second coil layer including a second inner coil unit and a second out coil unit, wherein the second inner coil unit is one of the two or more coil units wound along the first coil path and the second outer coil unit is another one of the two or more coil units wound along the second coil path.

5. The gradient coil assembly of claim 4, wherein the first inner coil unit is electrically connected with the second outer coil unit, and the first outer coil unit is electrically connected with the second inner coil unit.

6. The gradient coil assembly of claim 5, wherein the first inner coil unit includes a first end extending to a center of the first coil layer;

the first outer coil unit includes a second end extending to the center of the first coil layer;

the second inner coil unit includes a third end extending to a center of the second coil layer; and the second outer coil unit includes a fourth end extending to the center of the second coil layer, wherein the first inner coil unit is electrically connected with the second outer coil unit by electrically connecting the first end and the fourth end; and the first outer coil unit is electrically connected with the second inner coil unit by electrically connecting the second end and the third end.

7. The gradient coil assembly of claim 6, wherein the first inner coil unit includes a first inner conductor and a first outer conductor that are co-wound along the first coil path to form the first inner coil; and the first outer coil unit includes a second inner conductor and a second outer conductor that are co-wound along the second coil path to form the first outer coil, wherein an end of the first inner conductor at an edge of the first coil layer being electrically connected with an end of the first outer conductor at the edge of the first coil layer; and an end of the second outer conductor at the edge of the first coil layer being connected with an end of the second inner conductor at the edge of the first coil layer.

8. The gradient coil assembly of claim 6, wherein the first inner coil unit includes a fifth end at an edge of the first coil layer;

the first outer coil unit includes a sixth end at the edge of the first coil layer;

the second inner coil unit includes a seventh end at an edge of the second coil layer; and the second outer coil unit includes an eighth end at the edge of the second coil layer, wherein the fifth end and the sixth end are packaged as a first interface; and the seventh end and the eighth end are packaged as a second interface.

9. The gradient coil assembly of claim 1, wherein the primary gradient coil or the shielding gradient coil includes a saddle coil or a Maxwell coil.

10. The gradient coil assembly of claim 1, wherein the primary gradient coil or the shielding gradient coil includes at least one of an X-axis coil, a Y-axis coil, or a Z-axis coil.

11. A superconducting magnet device including a superconducting magnet, a gradient coil, and a shimming structure, the shimming structure comprising:

a support unit arranged between the gradient coil and the superconducting magnet, wherein at least one accommodating cavity is formed between the support unit and the superconducting magnet; and a shimming unit arranged within the at least one accommodating cavity, wherein the shimming structure further includes a first end-ring connected to a first end of the support unit and a first end of the shimming unit.

12. The superconducting magnet device of claim 11, wherein the support unit is further configured to support the gradient coil.

13. The superconducting magnet device of claim 11, wherein the superconducting magnet forms a bore that has an axis, and the shimming structure is arranged in the bore.

14. The superconducting magnet device of claim 13, wherein the gradient coil includes a primary gradient coil and a shielding gradient coil, the primary gradient coil and the shielding gradient coil being arranged co-axially around the axis of the bore, and the shielding gradient coil being peripheral to the primary gradient coil in reference to the axis of the bore, wherein the shielding gradient coil includes at least two coil units, one of the at least two coil units being wound along a first coil path;

another one of the at least two coil units being wound along a second coil path; and the first coil path is different from the second coil path.

15. The superconducting magnet device of claim 11, wherein the support unit includes:

a support drum arranged co-axially with the bore around the axis and configured to support the gradient coil; and a plurality of support bars arranged around the axis and parallel to the axis, wherein the plurality of support bars are placed between and connected to an outer surface of the support drum and an inner surface of the superconducting magnet, such that the at least one accommodating cavity is formed between the support drum and the superconducting magnet.

16. The superconducting magnet device of claim 11, wherein the shimming structure further includes a second end-ring connected to a second end of the support unit and a second end of the shimming unit.

17. The superconducting magnet device of claim 11, wherein the shimming unit includes a main shimming bar and at least two auxiliary shimming bars that are arranged along a circumferential direction of the superconducting magnet, the main shimming bar being arranged between the at least two auxiliary shimming bars.

18. The superconducting magnet device of claim 17, wherein a width of the main shimming bar along the circumferential direction of the superconducting magnet is greater than a width of each of the at least two auxiliary shimming bars along the circumferential direction of the superconducting magnet.

19. A magnetic resonance imaging (MRI) system, comprising:

a main magnet configured to generate a primary magnetic field, the primary magnet forming a bore;

a gradient coil arranged in the bore and configured to generate a gradient magnetic field that provides a magnetic field environment with the primary magnetic field, the gradient coil including a shielding gradient coil including two or more coil units, wherein the two or more coil units are co-wound starting from a same center, wherein one of the two or more coil units is wound along a first coil path;

another one of the two or more coil units is wound along a second coil path;

the first coil path is different from the second coil path; and currents respectively corresponding to the two or more coil units are in parallel; and a shimming structure arranged between the gradient coil and the primary magnet and configured to homogenize the primary magnetic field, the shimming structure including a support unit arranged between the gradient coil and
   the primary magnet, wherein at least one accommo-
   dating cavity is formed between the support unit and
   the primary magnet; and
a shimming unit arranged within the at least one accom-
   modating cavity.

* * * * *